United States Patent
Ohkubo et al.

[19]

[11] Patent Number: 5,923,231

[45] Date of Patent: Jul. 13, 1999

[54] SURFACE ACOUSTIC WAVE DEVICE WITH AN ELECTRODE INSULATING FILM AND METHOD FOR FABRICATING THE SAME

[75] Inventors: Yukio Ohkubo; Takahiro Sato, both of Toda, Japan

[73] Assignee: Kinseki Limited, Tokyo, Japan

[21] Appl. No.: 08/666,447

[22] PCT Filed: Aug. 4, 1995

[86] PCT No.: PCT/JP95/01554

§ 371 Date: Sep. 13, 1996

§ 102(e) Date: Sep. 13, 1996

[87] PCT Pub. No.: WO96/04713

PCT Pub. Date: Feb. 15, 1996

[30] Foreign Application Priority Data

Aug. 5, 1994 [JP] Japan .................................. 6-202991
Oct. 20, 1994 [JP] Japan .................................. 6-279737
Oct. 20, 1994 [JP] Japan .................................. 6-279738

[51] Int. Cl.$^6$ .......................... H03H 9/145; H03H 9/25; H03H 9/64

[52] U.S. Cl. ................. 333/193; 310/313 A; 310/313 B; 310/360; 29/25.35

[58] Field of Search ................... 333/150, 151, 333/153, 154, 193–196; 29/25.35; 310/313 R, 313 A, 313 B, 313 D, 360, 363, 364

[56] References Cited

FOREIGN PATENT DOCUMENTS

| | | | |
|---|---|---|---|
| 54-51390 | 4/1979 | Japan | .................................. 333/193 |
| 57-15514 | 1/1982 | Japan . | |
| 58-40848 | 9/1983 | Japan . | |
| 60-90412 | 5/1985 | Japan . | |
| 2-295211 | 12/1990 | Japan | .................................. 333/193 |
| 5-7124 | 1/1993 | Japan . | |
| 5-259802 | 10/1993 | Japan | .................................. 333/193 |
| 6-112763 | 4/1994 | Japan . | |
| 8-250967 | 9/1996 | Japan . | |

OTHER PUBLICATIONS

A copy of the International Search Report issued by the Japanese Patent Office for PCT/JP95/01554 (2 pages).

*Primary Examiner*—Robert Pascal
*Assistant Examiner*—Barbara Summons
*Attorney, Agent, or Firm*—Dickstein Shapiro Morin & Oshinsky LLP

[57] ABSTRACT

In a surface acoustic wave device for processing signals of relatively high frequencies, as of above 1 GHz, by the use of surface acoustic waves which propagate on the surface of a piezoelectric substrate, radiating bulk waves in the direction of depth of the piezoelectric substrate, an IDT structure is provided, which does not increase propagation loss and has sufficiently low electric resistance. The device comprises a piezoelectric substrate 10, and an electrode of a conducting film 12 for exciting, receiving, reflecting and/or propagating surface acoustic waves, and the surface acoustic waves propagate on the surface of the piezoelectric substrate, radiating at least one transverse component of bulk waves in the direction of depth of the piezoelectric substrate 10. An insulating film 18 has different thicknesses between first regions in the electrode, where the conducting film 12 is present, and second regions in the electrode, where the conducting film 12 is absent so that acoustic impedances of the first and the second regions with respect to the surface acoustic waves are substantially equal to each other.

21 Claims, 20 Drawing Sheets

SURFACE ACOUSTIC WAVE DEVICE WITH AN ELECTRODE INSULATING FILM AND METHOD FOR FABRICATING THE SAME

TECHNICAL FIELD

The present invention relates to a surface acoustic wave device using, as a propagation mode, surface acoustic waves, such as leaky waves, longitudinal leaky waves, etc., which propagate radiating bulk waves in the direction of depth of a piezoelectric substrate, and a method for fabricating the same.

BACKGROUND ART

Surface acoustic wave devices are circuit devices which conduct signal processing of converting electric signals to surface acoustic waves, and they are used in filters, resonators, delay lines, etc. Usually electrodes of conducting film of, e.g., metal, which are called inter-digital transducers (IDTs) are formed on a piezoelectric substrate for converting electric signals to surface acoustic waves, and vice versa.

Characteristics of the surface acoustic waves depend on propagation characteristics thereof on the piezoelectric substrates. Especially for higher frequencies of the surface acoustic wave devices, the piezoelectric substrates must have high propagation velocities for the surface acoustic waves.

As substrate materials for surface acoustic waves, quartz, lithium tantalate ($LiTaO_3$), lithium niobate ($LiNbO_3$), lithium tetraborate ($Li_2B_4O_7$), etc., are conventionally known. As surface acoustic waves to be used in the surface acoustic wave devices, Rayleigh waves and leaky surface waves are mainly known.

Rayleigh waves are surface acoustic waves which propagate on the surfaces of elastic bodies, and propagate without radiating their energy into the elastic bodies, i.e., without theoretical propagation losses. As substrate materials to be used in the surface acoustic wave devices using Rayleigh waves, an ST-cut quartz with a 3100 m/sec propagation velocity, an X-cut 112°-Y propagating $LiTaO_3$ of a 3300 m/sec propagation velocity, 128°-rotated Y-cut X-propagating $LiNbO_3$ with a 4000 m/sec propagation velocity, a 45°-rotated X-cut Z-propagating $Li_2B_4O_7$ with a 3400 propagation velocity, etc., are known.

On the other hand, the use of leaky surface waves in the surface acoustic wave devices have been studied. The leaky surface waves are surface acoustic waves which propagate on the surfaces of elastic bodies, radiating one transverse component thereof as bulk waves in the direction of depth of the elastic bodies.

Generally, leaky surface waves have such large propagation losses due to the above radiation that it is difficult to use leaky surface waves in the surface acoustic wave devices. At a certain cut angle and in a certain propagation direction, however, usually the propagation losses are relatively small, thus leaky surface waves could be used in the surface acoustic wave devices.

Leaky surface waves, which have higher propagation velocity than Rayleigh waves, are widely used in surface acoustic wave devices for relatively high frequencies (above the UHF band).

As substrate materials for the surface acoustic wave devices using leaky surface waves, an LST-cut quartz with a 3900 m/sec propagation velocity, a 36°-rotated Y-cut X-propagating $LiTaO_3$ with a 4200 m/sec propagation velocity, a 41°-rotated Y-cut X-propagating $LiNbO_3$ with a 4500 m/sec propagation velocity, a 64°-rotated Y-cut X-propagating $LiNbO_3$ with a 4500 m/sec propagation velocity, etc., are known.

The inventors of the present application recently further developed the theory of leaky surface waves and ascertained the presence of surface waves (hereinafter called longitudinal leaky waves) which propagate with the longitudinal waves as the main component, radiating two transverse wave components as bulk waves into substrates.

They ascertained the presence of surface acoustic waves of a propagation velocity as high as 5000–7500 m/sec on lithium tetraborate ($Li_2B_4O_7$) whose cut angles and propagation directions are an Eulerian angle representation of (0°–45°, 30°–90°, 40°–90°) and a direction equivalent to the representation (see Japanese Patent Laid-Open Publication No. 112763/1994).

It is known that especially, in a case that cut angles and propagation directions are an Eulerian angle representation of (0°–45°, 38°–55°, 80°–90°) and a direction equivalent to the representation, the surface acoustic waves not only have a propagation velocity as high as 6500–7200 m/sec, but also exhibit a large electromechanical coupling coefficient ($k^2$) and good propagation characteristics having low propagation loss.

It is possible to apply leaky surface waves and longitudinal leaky surface waves, whose propagation velocity is, as described above, generally higher than Rayleigh waves, which are applicable to surface acoustic wave devices of high frequencies.

It is known that to use leaky surface waves and longitudinal leaky surface waves in surface acoustic wave devices, at least one IDT is necessary, and propagation characteristics vary greatly with thicknesses of the IDT. That is, the IDT is usually formed of a metal film which comprises aluminium (Al) as a main component, and it is known that characteristics of the surface acoustic waves vary depending on thicknesses (normalized film thickness $h/\lambda$) of the conducting film normalized by wavelengths of the surface acoustic waves.

Because a conducting film of, e.g., Al, abruptly increases the resistivity as its thickness increases, it is general that the conducting film is set at a film thickness of above 1000 Å which permits the electric resistance to be decreased Accordingly this sets a lower threshold of values of the normalized film thickness ($h/\lambda$) which can sufficiently decrease the electric resistance As the surface acoustic wave devices have higher frequencies, the surface acoustic waves have shorter wavelengths. A lower threshold value of a required normalized film thickness is increased up to above 1–2%.

For example, in a case that 1 GHz frequency signals are processed by using leaky surface waves and longitudinal leaky surface waves, a required normalized film thickness is above 2.5% for LST cut crystal, above 2.3% for 36° Y-cut X-propagation $LiTaO_3$, above 2.2% for 41° Y-cut X-propagation $LiNbO_3$, and above 1.5% for $Li_2B_4O_7$ of cut angles and propagation directions of an Eulerian angle representation of (0°, 47.3°, 90°). For high frequencies, the normalized film thickness has larger lower threshold values.

The inventors of the present application, however, conducted a numerical simulation of dispersion characteristics of leaky surface waves and longitudinal leaky surface waves and obtained a result that propagation losses of the leaky surface waves and the longitudinal leaky surface waves abruptly increase when the metal film on the substrate surface is thicker than a normalized film thickness.

Next, the computing method for the simulation and the result of the computation will be explained.

The numerical simulation was conducted on a single electrode which is usually used as an IDT. FIG. 1 shows the computation model. Electrodes (strips) 12 are formed on a piezoelectric substrate 10 at a pitch P in the direction of propagation of surface acoustic waves. A electrode width is represented by M, and a film thickness is represented by Hm. A direction of propagation of surface acoustic, waves on the surface of the piezoelectric substrate 10 is represented by X1, a direction of depth of the piezoelectric substrate 10 is represented by X3, and directions perpendicular to the directions X1; X3 are respectively represented by X2. The propagation characteristics of the surface acoustic waves of the IDT generate first Bragg reflection by the periodic perturbation effect of the electrodes and frequency dispersion of the propagation coefficient κ (wave number). First, the frequency dispersion of the propagation coefficient κ will be computed. A displacement Ui of surface acoustic waves and an electrostatic potential Φ are expressed by an addition of space harmonics given by the following formulas 1 to 4, using Floquet's theorem.

$$U_i^{sub} = \sum_{m=-\infty}^{\infty} \sum_{n=1}^{4} A^{(m,n)} \times \beta_i^{(m,n)} \times \qquad \text{Formula 1}$$
$$\exp j\left\{\kappa\alpha^{(m,n)}X_3 - \left(\kappa + \frac{2mP}{\pi}X_1 + \omega t\right)\right\}$$

$$\Phi^{sub} = \sum_{m=-\infty}^{\infty} \sum_{n=1}^{4} A^{(m,n)} \times \beta_4^{(m,n)} \times \qquad \text{Formula 2}$$
$$\exp j\left\{\kappa\alpha^{(m,n)}X_3 - \left(\kappa + \frac{2mP}{\pi}X_1 + \omega t\right)\right\}$$

$$U_i^{metal} = \sum_{m=-\infty}^{\infty} \sum_{n=5}^{10} A^{(m,n)} \times \beta_i^{(m,n)} \times \qquad \text{Formula 3}$$
$$\exp j\left\{\kappa\alpha^{(m,n)}X_3 - \left(\kappa + \frac{2mP}{\pi}X_1 + \omega t\right)\right\}$$

$$U^{free} = \sum_{m=-\infty}^{\infty} A^{(m,0)} \times \exp j\left\{\kappa\alpha^{(m,0)}X_3 - \left(\kappa + \frac{2mP}{\pi}X_1 + \omega t\right)\right\} \qquad \text{Formula 4}$$

Here, an attenuation coefficient $\alpha^{(m,n)}$ for the direction X3 of propagation of surface acoustic waves and an amplitude coefficient $\beta i^{(m,n)}$ are given by setting a propagation coefficient κ and an angular frequency ω and by solving for m in the respective regions the equation of motion given by Formula 5 and Maxwell's equations of Formula 6 on quasielectrostatic approximation.

Formula 5

$$C_{ijkl} U_{k,li} + e_{kij}\phi_{,ki} = \rho\ddot{U}_j$$

Formula 6

$$e_{ikl} U_{k,li} + \epsilon_{ik}\phi_{,ki} = 0 \qquad (i,j,k,l=1,2,3)$$

where Cijkl, ekij, and εik respectively represent tensors of an elastic coefficient, a piezoelectric coefficient and a dielectric constant, and φ represents a density.

An amplitude constant $A^{(m,n)}$ of the space harmonics is given by substituting Formulas 1 to 4 into boundary conditions As mechanical boundary conditions, displacements U1, U2, U3 are continuous below the electrodes, stresses T31, T32, T33 are continuous below the electrodes, and the stresses T31, T32, T33 are 0 between the electrodes As electric boundary conditions, the potential Φ is constant below the electrodes, a boundary of the potential φ and an electric flux density, and a perpendicular component D3 are continuous between the electrodes In a shorted strip, in which electrodes are shorted with each other, a potential Φ on the strips must be 0. In an open strip, in which electrodes are not shorted with each other, total charges on the electrodes must be 0.

A propagation coefficient κ for an angular frequency ω can be given by the above computation. The computation was made with a sufficiently high order m of the space harmonics.

Generally, a periodic perturbation due to the electrodes generates a stop band in which a propagation coefficient satisfies the first Bragg's reflection condition (Re(κ)=π/P). Frequencies on both edges of a stop band of the short strip are represented respectively by fs1 and fs2, and frequencies on both edges of a stop band of the open strip are represented respectively by fo1 and fo2. Imaginary components of propagation coefficients κ are 0 (Im(κ)=0) for Rayleigh waves, which, in computation, generate no propagation loss, but those for leaky surface waves and longitudinal leaky surface waves are not 0 (Im(κ) 0).

Based on frequencies on the edges of stop bands of the short strip and the open strip, parameters necessary for a Smith's cross-field model, which is widely used as a surface acoustic wave device design method, can be extracted. As the parameters were given an acoustic impedance mismatch ε(ε=(Zo/Zm)−1, where Zo represents an acoustic impedance of parts having no strips, and Zm represents an acoustic impedance of parts having strips), and a susceptance Be indicating an energy storage effect and an electromechanical coupling factor $k^2$.

In a case that an array of strips is bidirectional, frequencies agree with each other at either of stop band edges of the short strip and the open strip, but do not agree, in a case that the array of strips is unidirectional (E. L. Adler et al, "Arbitrarily Oriented SAW Gratings: Network Model and the Coupling-of-Modes Description", IEEE trans. on Ultrason. Ferroelec. Freq. Contr., vol. UFFC-38, no. 3, pp. 220–230 (1991)). In this case, a susceptance Be indicating the unidirection was also given. Propagation loss αs1; αs2 at the stop band edges fs1; fs2 of the short strip, and propagation losses αo1; αo2 at the stop band edges fo1; fo2 were taken from a value of the propagation loss used in the Smith's cross-field model, where the wave number in the model coincides with the wave number obtained from the given dispersion curves.

Next, as one example of the specific computation, FIGS. 2 to 5 show computed values of dependence of dispersion characteristics of $Li_2B_4O_7$ of cut angles and propagation directions of an Eulerian angle representation of (0°, 47.30°, 90°) with respect to longitudinal leaky surface waves on the Al film thickness.

FIGS. 2 to 5 respectively show propagation losses αs1, αs2 at the stop band edges, electromechanical coupling factors $k^2$, susceptances Be which are indicative of energy storage effects, and acoustic impedance mismatches ε. The susceptances Be are normalized by the acoustic admittances (inverse numbers of acoustic impedances Zo). Here, a temperature was 25° C., a strip width (M/P) normalized by a strip pitch P was 0.5, and the strips were formed of aluminium. Based on these values it is shown that a propagation loss is above 0.04 dB/λ when a normalized aluminium film thickness which is normalized by a value 2P twice the strip pitch is above 1.7%. Thus, it is found that it is difficult to design a surface acoustic wave device which is operative at relatively high frequencies when the Al film is set at a normalized film thickness of a sufficiently small electric resistance.

Similarly, also with respect to other leaky surface waves, the propagation loss is large at normalized film thicknesses which are 1.5–4.0%.

As described above, in using surface acoustic waves, such as longitudinal leaky surface waves, which propagate, radiating bulk waves in the direction of depth of a piezoelectric substrate, since the propagation loss increases when a normalized film thickness of the IDT exceeds a certain extent, the propagation loss is large at a sufficiently low internal electric resistance of the electrodes, and resultantly insertion losses of surface acoustic wave devices are largered.

As described above, a surface acoustic wave device, which converts electric signals to surface acoustic waves propagating on the surface of a piezoelectric substrate, and vice versa, by the use of an IDT (inter-digital transducer) provided on the piezoelectric substrate, functions as a filter, resonator, delay lines, etc. The typical structure of the IDT comprises, as shown in FIG. 6A, a plurality of pairs of electrodes 12 in the form of metal strips which are arranged on a piezoelectric substrate 10. The electrodes 12 have a thickness necessary to ensure low internal electric resistance in the IDT.

As in a case, however, that a normalized film thickness $h/\lambda$ normalized by an IDT pitch is above 1%, when the metal strips are relatively thick, reflection of the surface waves on the boundary portions of the metal strips is a problem. This reflection increases deformation of frequency response, which hinders the intended characteristics.

As a structure of the IDT included in the conventional surface acoustic wave device, there is a known structure whose sectional view is shown in FIG. 6B (see Japanese Patent Publication No. Tokkyosho 56-36604/1978)

In the IDT structure shown in FIG. 6B, recesses 14 are in advance formed in regions of a piezoelectric substrate 10 where electrodes 12 are to be formed, and the electrodes 12 are formed in the recesses 14. Because of the piezoelectric substrate 10 present between the side surfaces of the electrodes 12, mass discontinuity can be decreased. This conventional technique intends to reduce the effect of the reflection for improved characteristics Propagation characteristics of the surface waves vary with depths of the recesses 14, and it is necessary to accurately control the depth of the recesses 14. The piezoelectric substrate 10 can be much damaged depending on the method for forming the recesses 12, and required piezoelectric characteristics can not often be obtained.

According to the invention of Japanese Patent Publication No. Tokkosho 56-36604/1981, the electrode portions are disposed on the recess bottoms, and the depth of the recesses is so set that acoustic impedances of surface acoustic waves at the electrode portions and the portions without the electrodes are substantially equal to each other, whereby reflection on the electrodes is reduced.

As a structure of the IDT included in the conventional surface acoustic wave device, there is known a structure whose sectional view is shown in FIG. 6C.

In the IDT structure shown in FIG. 6C, a mask which is opened except regions thereof where electrodes 12 are to be formed in is formed on an aluminium metal layer formed on the entire surface, and parts of the aluminium layer in the opened regions are anode-oxidized to form anode oxide films 16 between the side surfaces of the electrodes 12. Because of masses of the anode oxide films 16 between the electrodes 12, mass discontinuity can be decreased (see Japanese Patent Publication No. Tokkyosho 59-8964/1984)

A thickness of the anode oxide film 16, however, is defined by a thickness of the aluminium metal layer forming the electrodes 12, and a metal material forming the electrodes 12 and a thickness of the electrodes 12 are also limited by the fabrication process.

Thus, it has been conventionally difficult to fabricate IDTs of structures which can decrease the mass discontinuity of the IDTs.

An object of the present invention is to provide a surface acoustic wave device which uses surface acoustic waves, such as longitudinal leaky surface waves, which propagate, radiating bulk waves in the direction of depth of a piezoelectric substrate, and which can signal process relatively high frequencies without increasing propagation losses and with sufficiently low electric resistance.

Another object of the present invention is to provide a method for fabricating a surface acoustic wave device, which can decrease mass discontinuity at the electrodes, causes no deformation of frequency response waveforms, and can effectively prevent degradation of propagation characteristics.

DISCLOSURE OF THE INVENTION

A surface acoustic wave device according to the present invention is characterized in that the surface acoustic device comprises: a piezoelectric substrate; an electrode formed of a conducting film formed on the piezoelectric substrate for exciting, receiving, reflecting and/or propagating surface acoustic waves; and an insulating film formed in at least a second regions of a first region in the electrode where the conducting film is formed and the second region in the electrode where the conducting film is not formed, the surface acoustic wave propagating on the surface, radiating at least one transverse component of bulk waves in a direction of depth of the piezoelectric substrate, a thickness Hp1 (Hp1$\geq$0) of the insulating film in the first region and a thickness Hp2 (Hp2$\geq$0) of the insulating film in the second region are so set that the first region and the second region have substantially equal acoustic impedances with respect to the surface acoustic waves.

Thus, according to the present invention, the first region and the second region have substantially equal acoustic impedances with respect to the surface acoustic waves, thus mass discontinuity at the electrodes are decreased, whereby the surface acoustic wave device uses surface acoustic waves, such as longitudinal leaky surface waves, which propagate, radiating bulk waves in the direction of depth of a piezoelectric substrate, and can signal process relatively high frequencies without increasing propagation losses and with sufficiently low electric resistance.

In the above-described surface acoustic wave device, the insulating film may cover the first region.

In the above-described surface acoustic wave device, it is preferable that a step difference (Hm+Hp1–Hp2) of the surface of the insulating film at a boundary between the first region and the second region satisfies the following formula:

$$-0.03 \leq (Hm+Hp1-Hp2)/\lambda \leq 0.01,$$

where a thickness of the conducting film is represented by Hm, a thickness of the insulating film in the first region is represented by Hp1 (Hp1$\geq$0), a thickness of the insulating film in the second region is represented by Hp2 (Hp2$\geq$0), and a wavelength of the surface acoustic waves is represented by $\lambda$.

In the above-described surface acoustic wave device, it is preferable that a step difference (Hm+Hp1–Hp2)/(2) of the surface of the insulating film normalized by 2P at a boundary between the first region and the second region satisfies the following formula:

$$-0.108 \times Hm/(2P) - 8.5 \times 10^{-3} \leq (Hm+Hp1-Hp2)/(2P) \leq -0.150 \times Hm/(2P) - 1.0 \times 10^{-3},$$

where a thickness of the conducting film is represented by Hm, a thickness of the insulating film in the first region is represented by Hp1 (Hp1≧0), a thickness of the insulating film in the second region is represented by Hp2 (Hp2≧0), and a pitch of electrodes of the conducting film in the electrode is represented by P.

In the above-described surface acoustic wave device, it is preferable that a step difference (Hm+Hp1−Hp2)/(2P) of the surface of the insulating film normalized by 2P at a boundary between the first region and the second region satisfies the following formula:

$$-0.09 \times Hm/(2P) - 6.6 \times 10^3 \leq (Hm+Hp1-Hp2)/(2P) \leq -0.24 \times Hm/(2P) + 9.1 \times 10^{-3},$$

where a thickness of the conducting film is represented by Hm, a thickness of the insulating film in the first region is represented by Hp1 (Hp1≧0), a thickness of the insulating film in the second region is represented by Hp2 (Hp2>0), and a pitch of electrodes of the conducting film in the electrode is represented by P.

In the above-described surface acoustic wave device, it is preferable that the piezoelectric substrate is a lithium tetraborate substrate.

In the above-described surface acoustic wave device, it is preferable that a cut angle of the surface of the piezoelectric substrate and a propagation direction of the surface acoustic waves are an Eulerian angle representation of (0°–45°, 38°–55°, 80°–90°) and in a range equivalent thereto.

In the above-described surface acoustic wave device, it is preferable that a cut angle of the surface of the piezoelectric substrate and a propagation direction of the surface acoustic waves are an Eulerian angle representation of (0°–45°, 30°–90°, 40°–65°) and in a range equivalent thereto.

A method for fabricating a surface acoustic wave device according to the present invention is characterized in that the method for fabricating the same comprises: a first step of forming a conducting film in a required pattern on a piezoelectric substrate to form an electrode for exciting, receiving, reflecting and/or propagating surface acoustic waves; a second step of forming an insulating film in at least a second region of a first region in the electrode where the conducting film is formed and the second region in the electrode where the conducting film is not formed; and a third step of setting a thickness Hp1 (Hp1≧0) of the insulating film in the first region and a thickness Hp2 (Hp2>0) of the insulating film in the second region so that the first region and the second region have substantially equal acoustic impedances with respect to the surface acoustic waves.

Thus, according to the present invention, the first region and the second region have substantially equal acoustic impedances with respect to the surface acoustic waves, thus mass discontinuity at the electrodes are decreased, whereby the surface acoustic wave device can reduce propagation loss of surface acoustic waves, has better characteristics, and can be fabricated by this simple process.

In the above-described method for fabricating the surface acoustic wave device, the second step may be for forming the insulating film in the first region as well.

In the above-described method for fabricating the surface acoustic wave device, it is preferable that the third step includes: a planarization step of forming a planarizing film on the insulating film; and a etching step of etching the planarizing film until the insulating film in the first region is exposed, and further etching relatively much the insulating film in either of the first region or the second region under etching conditions which allow an etching rate ratio between the insulating film and the planarizing film to be a desired value.

In the above-described method for fabricating the surface acoustic wave device, it is preferable that the etching step is for dry etching, and the etching rate ratio between the insulating film and the planarizing film is controlled by changing etching pressures.

A method for fabricating a surface acoustic wave device according to the present invention is characterized in that the method for fabricating the same comprises: a first step of forming an insulating film on a piezoelectric substrate; a second step of forming on the insulating film a mask with an opening for a first region where a conducting film of an electrode is to be formed; a third step of removing the insulating film in the first regions by the use of the mask; a fourth step of forming the conducting film on the mask and the piezoelectric substrate in the first region; and a fifth step of removing the mask to remove the conducting film on the mask to thereby form the electrode of the conducting film in the first region.

Thus, according to the present invention, the insulating film and the conducting film are patterned by the use of one and the same mask, whereby no disalignment between the respective patterns takes place, and the respective patterns can be formed with good alignment. In addition, thicknesses of the insulating film and the conducting film can be set independently of each other, whereby the surface acoustic wave device has less mass interruption in the IDTs, can reduce propagation loss of surface acoustic waves, has better characteristics, and can be fabricated by this simple process.

In the above-described method for fabricating the surface acoustic wave device, it is preferable that surface acoustic waves excited, received, reflected and/or propagated by the surface acoustic wave device propagate on the surface of the piezoelectric substrate, radiating at least one transverse component of bulk waves in a direction of depth of the piezoelectric substrate.

In the above-described method for fabricating the surface acoustic wave device, it is preferable that a step difference (Hm+Hp1−Hp2) of the surface of the insulating film at a boundary between the first region and the second region satisfies the following formula:

$$-0.03 \leq (Hm+Hp1-Hp2)/\lambda \leq 0.01,$$

where a thickness of the conducting film is represented by Hm, a thickness of the insulating film in the first region is represented by Hp1 (Hp1≧0), a thickness of the insulating film in the second region is represented by Hp2 (Hp2>0), and a wavelength of the surface acoustic waves is represented by λ.

In the above-described method for fabricating the surface acoustic wave device, it is preferable that a step difference (Hm+Hp1−Hp2)/(2P) of the surface of the insulating film normalized by 2P at a boundary between the first region and the second region satisfies the following formula:

$$-0.108 \times Hm/(2P) - 8.5 \times 10^{-3} \leq (Hm+Hp1-Hp2)/(2P) \leq -0.150 \times Hm/(2P) - 1.0 \times 10^{-3},$$

where a thickness of the conducting film is represented by Hm, a thickness of the insulating film in the first region is represented by Hp1 (Hp1≧0), a thickness of the insulating film in the second region is represented by Hp2 (Hp2>0), and a pitch of electrodes of the conducting film in the electrode is represented by P.

In the above-described method for fabricating the surface acoustic wave device, it is preferable that a step difference (Hm+Hp1−Hp2)/(2P) of the surface of the insulating film normalized by 2P at a boundary between the first region and the second region satisfies the following formula:

$$-0.09 \times Hm/(2P) - 6.6 \times 10^{-3} \leq (Hm+Hp1-Hp2)/(2P) \leq -0.24 \times Hm/(2P) + 9.1 \times 10^{-3},$$

where a thickness of the conducting film is represented by Hm, a thickness of the insulating film in the first region is represented by Hp1 (Hp1≧0), a thickness of the insulating film in the second region is represented by Hp2 (Hp2>0), and a pitch of electrodes of the conducting film in the electrode is represented by P.

In the above-described method for fabricating the surface acoustic wave device, it is preferable that the piezoelectric substrate is a lithium tetraborate substrate In the above-described method for fabricating the surface acoustic wave device, it is preferable that a cut angle of the surface of the piezoelectric substrate and a propagation direction of the surface acoustic waves are an Eulerian angle representation of (0°–45°, 38°–55°, 80°–90°) and in a range equivalent thereto In the above-described method for fabricating the surface acoustic wave device, it is preferable that a cut angle of the surface of the piezoelectric substrate and a propagation direction of the surface acoustic waves are an Eulerian angle representation of (0°–45°, 30°–90°, 40°–65°) and in a range equivalent thereto

BEST MODE FOR CARRYING OUT THE INVENTION

Figure 1:
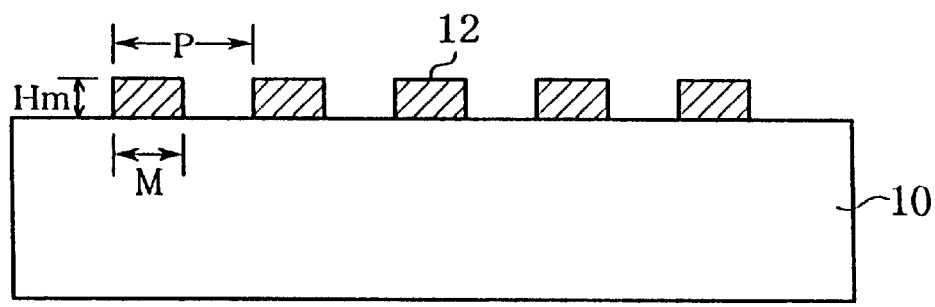
FIG. 1 is a view showing a sectional structure of a single electrode type IDT in a conventional surface acoustic wave device, on which the numerical simulation was conducted.
Figure 2:
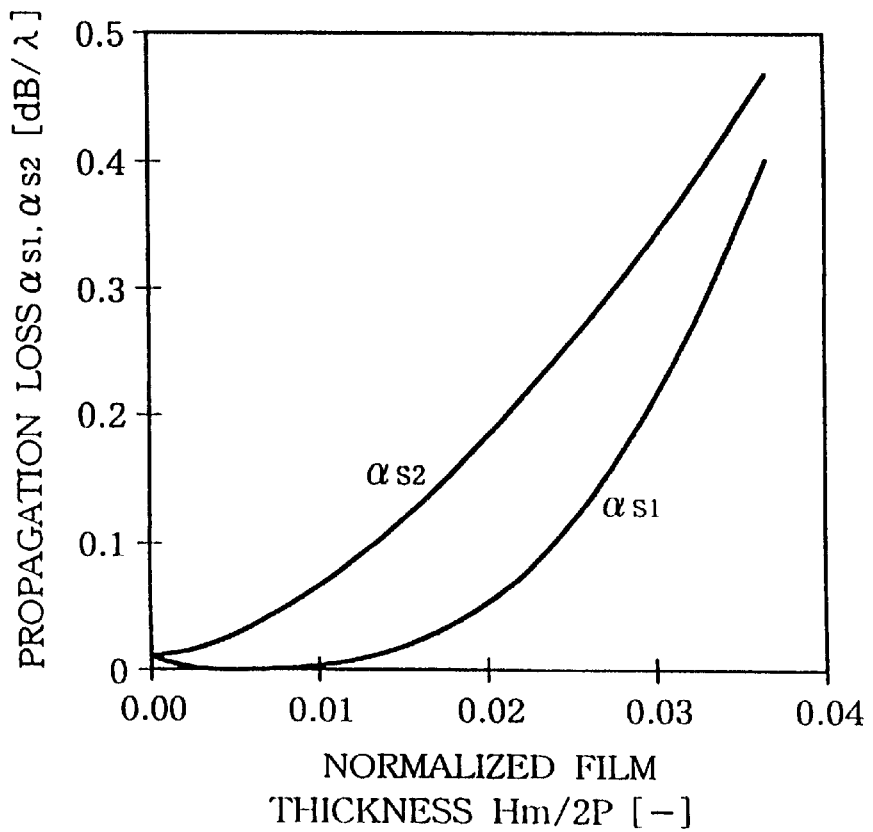
FIG. 2 is a graph of numerical simulation results of dependence on electrode film thickness for propagation losses αs1, αs2 at the stop band edges with respect to longitudinal leaky surface waves on a $Li_2B_4O_7$ substrate.
Figure 3:
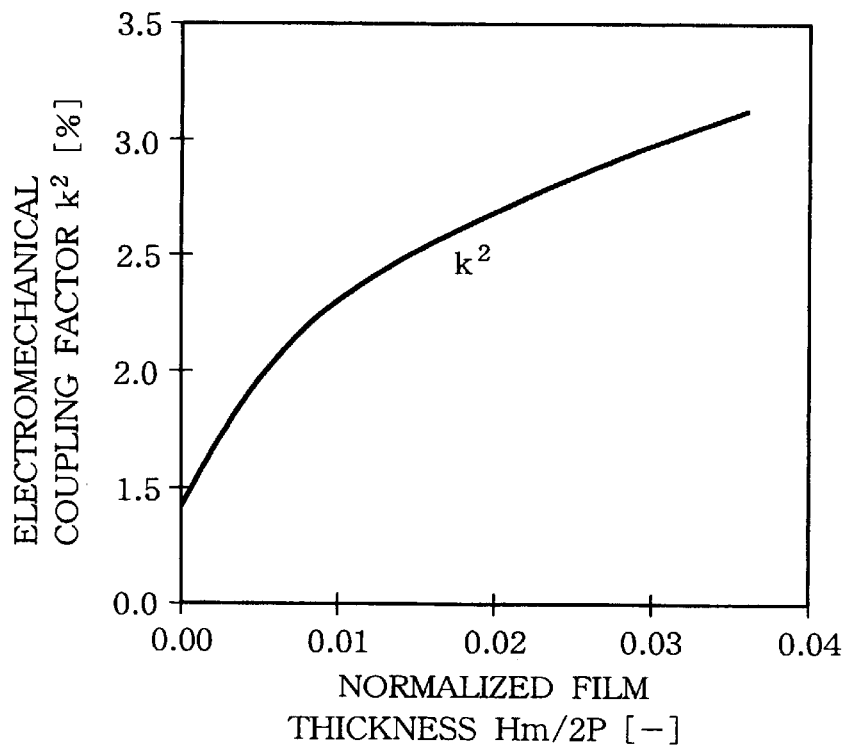
FIG. 3 is a graph of numerical simulation results of dependence on electrode film thickness for electromechanical factors $k^2$ with respect to longitudinal leaky surface waves on a $Li_2B_4O_7$ substrate.
Figure 4:
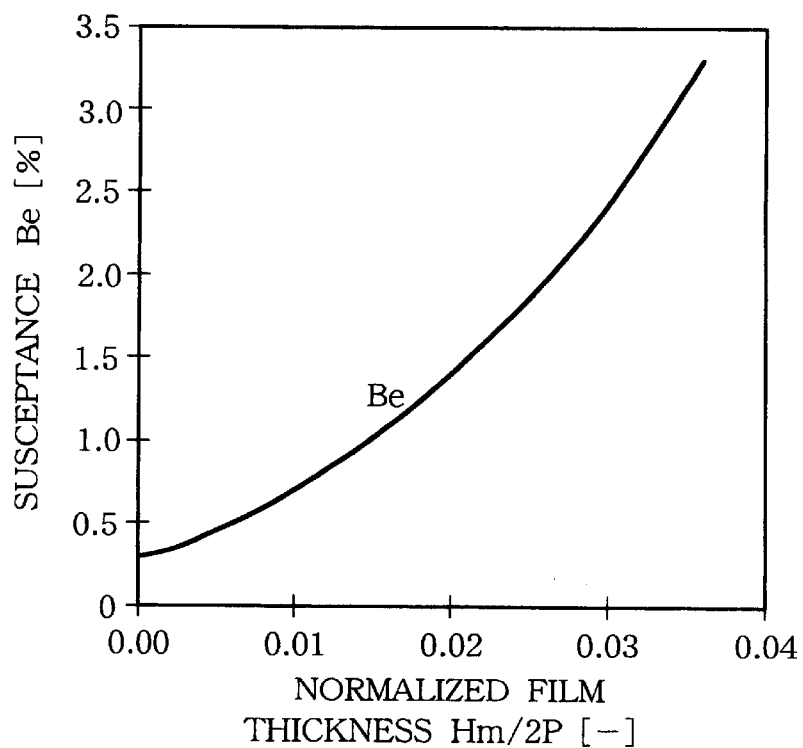
FIG. 4 is a graph of numerical simulation results of dependence on electrode film thickness for susceptances Br, Br indicative of energy storage effects and unidirection with respect to longitudinal leaky surface waves on a $Li_2B_4O_7$ substrate.
Figure 5:
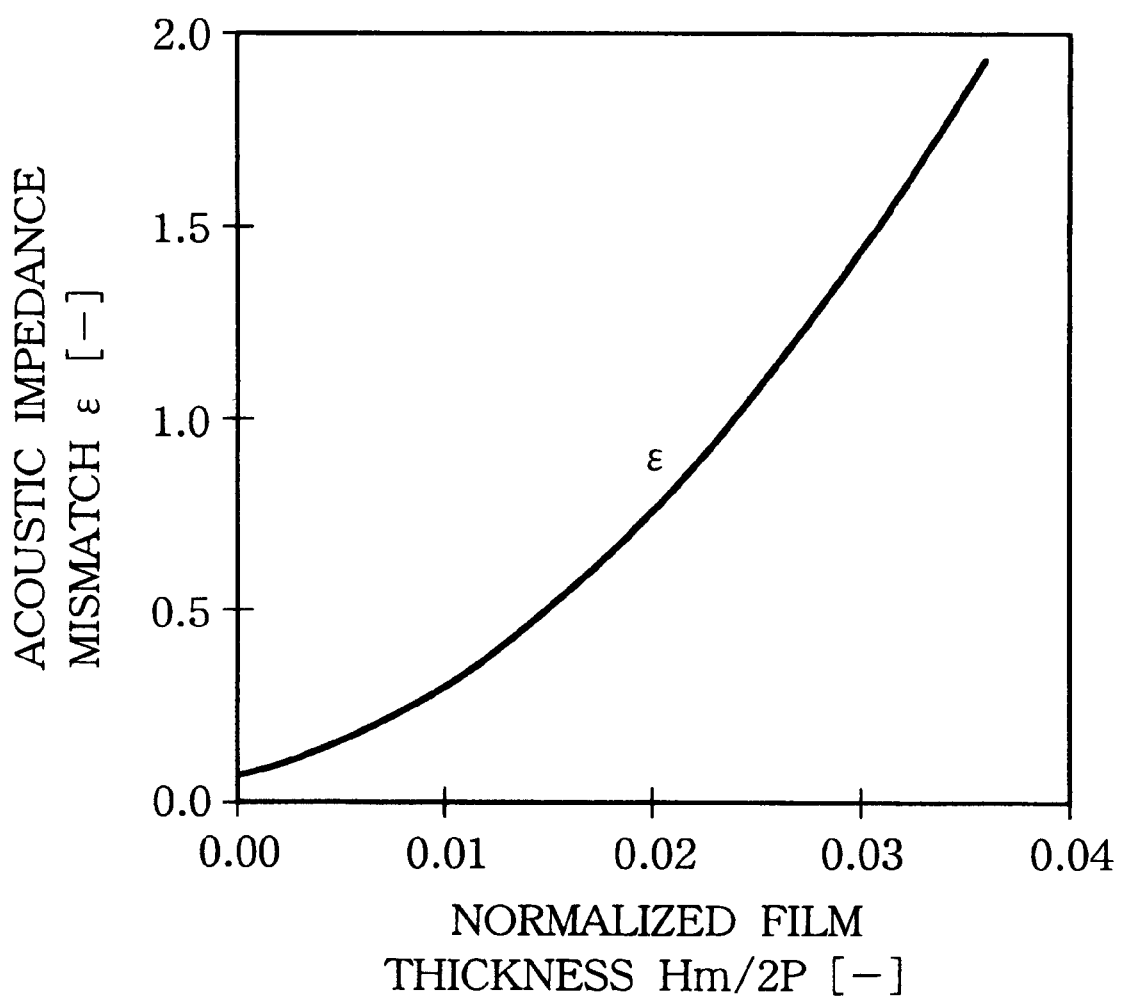
FIG. 5 is a graph of numerical simulation results of dependence on electrode film thickness for acoustic impedance mismatches ε with respect to longitudinal leaky surface waves on a $Li_2B_4O_7$ substrate.
Figure 6A:
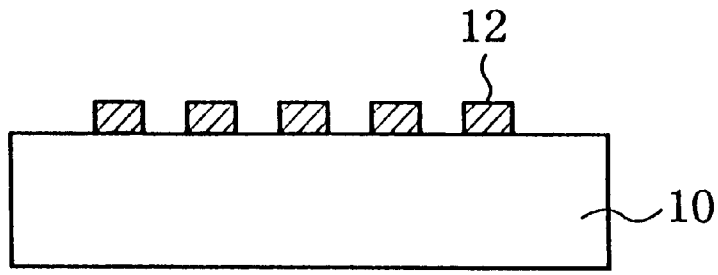
FIGS. 6A, 6B and 6C are sectional views explaining the electrode structures in the conventional surface acoustic wave device.
Figure 6B:
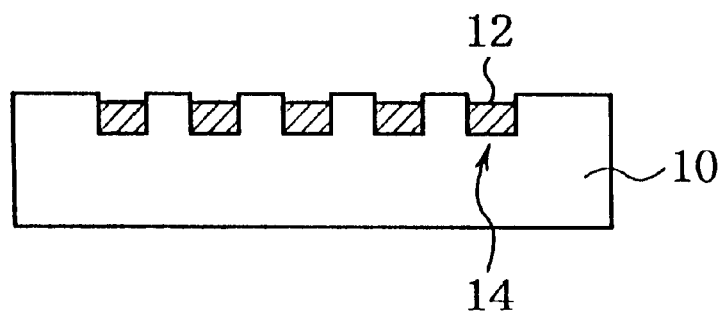
Figure 6C:
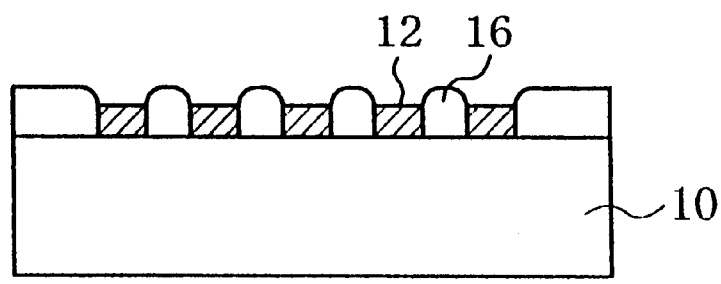
Figure 7:
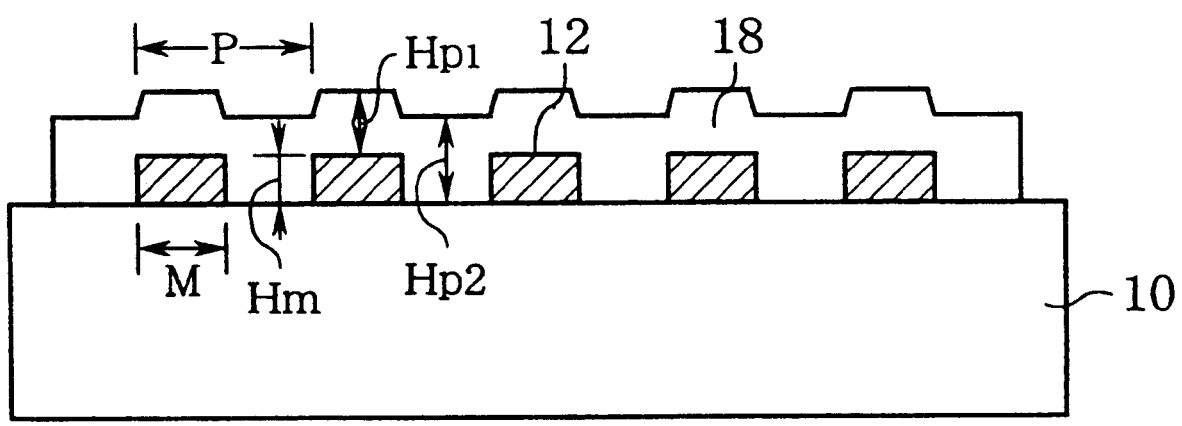
FIG. 7 is a view showing a sectional structure of a single electrode type IDT in a surface acoustic wave device according to the present invention, on which the numerical simulation was conducted.
Figure 8:
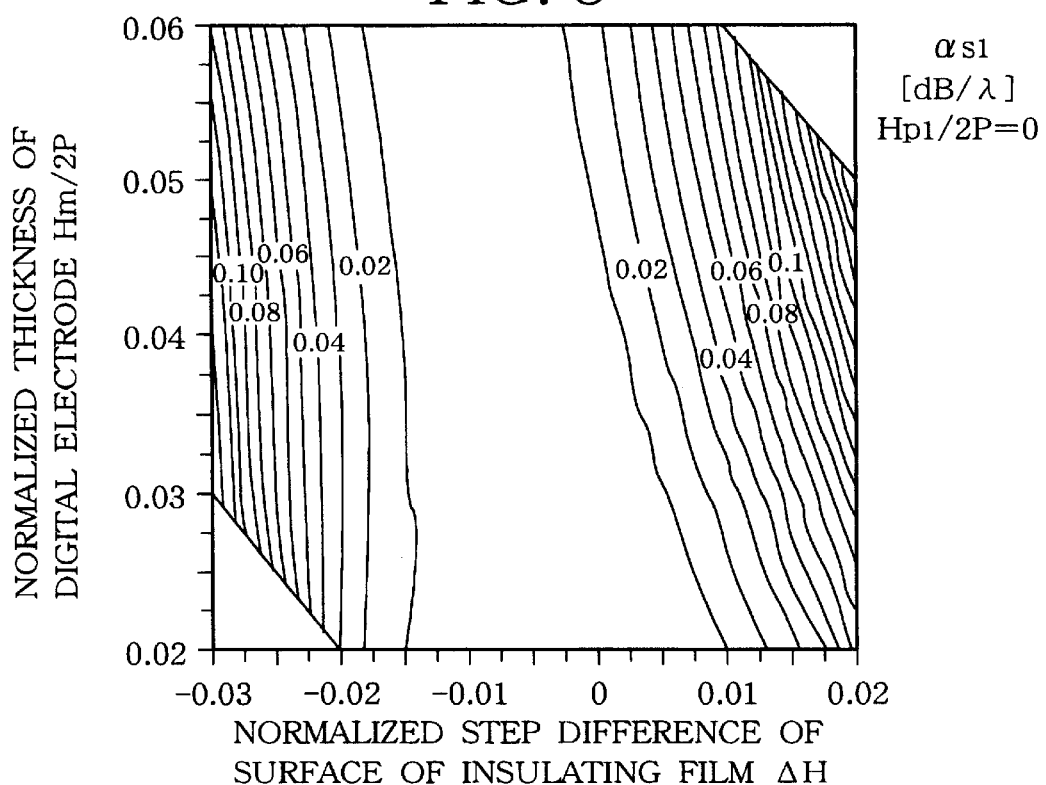
FIG. 8 is a graph of numerical simulation results of a propagation loss αs1 at the stop band edges in a case that the insulating film thickness Hp1/2P=0.
Figure 9:
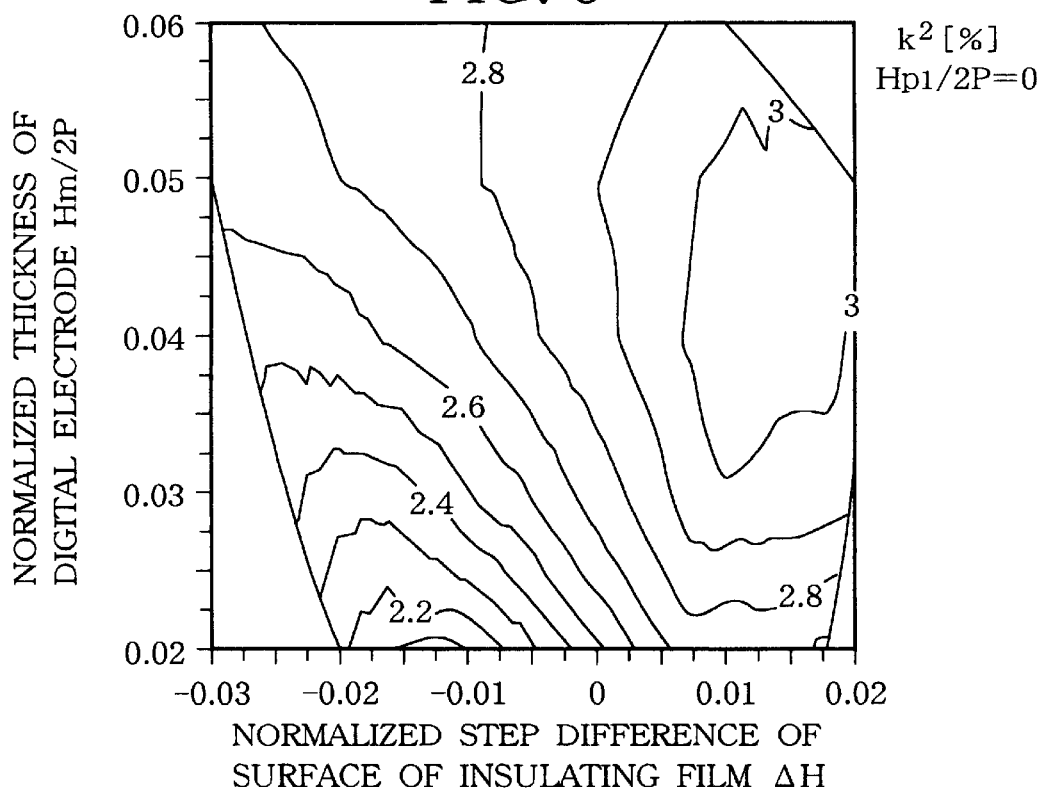
FIG. 9 is a graph of numerical simulation results of electromechanical factors $k^2$ in a case that the insulating film thickness Hp1/2P=0.
Figure 10:
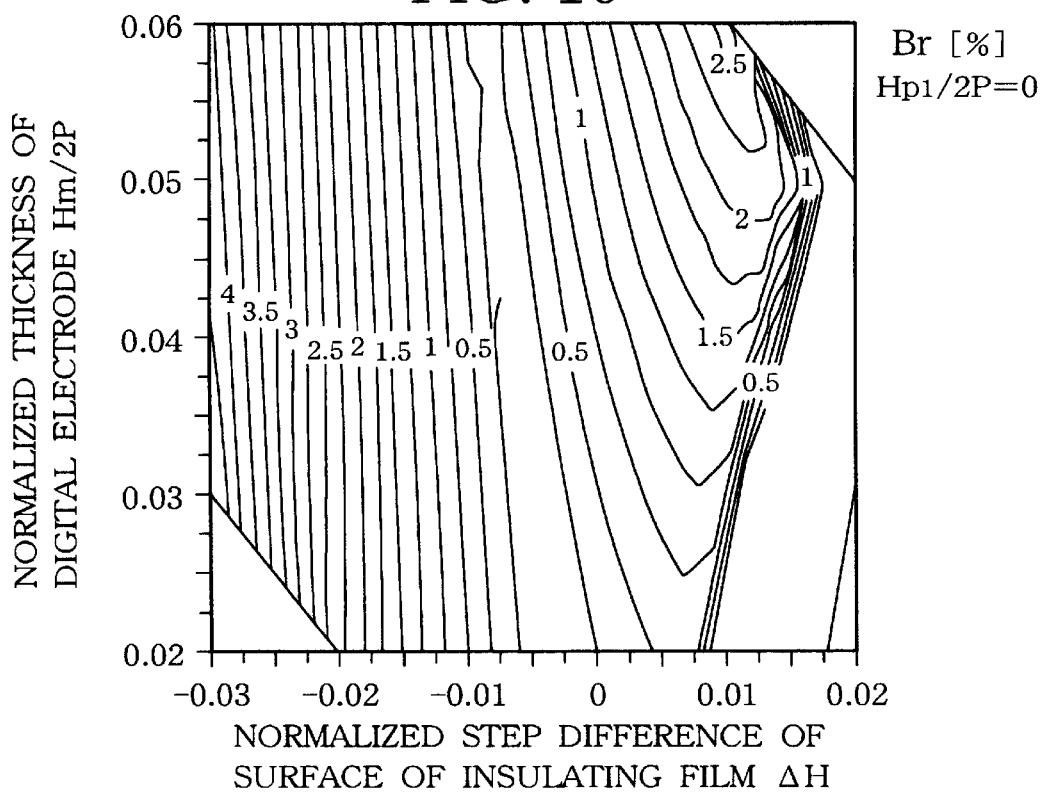
FIG. 10 is a graph of numerical simulation results of susceptances Be indicative of unidirection in a case that the insulating film thickness Hp1/2P=0.
Figure 11:
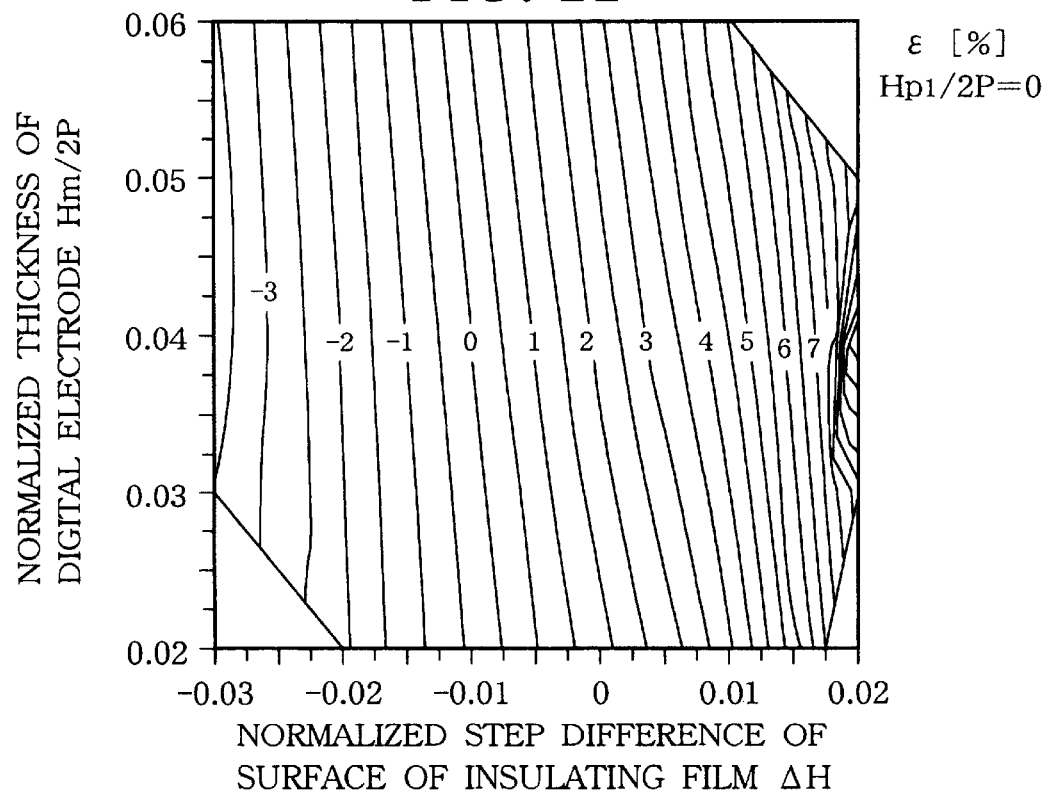
FIG. 11 is a graph of numerical simulation results of acoustic impedance mismatches ε in a case that the insulating film thickness Hp1/2P=0.
Figure 12:
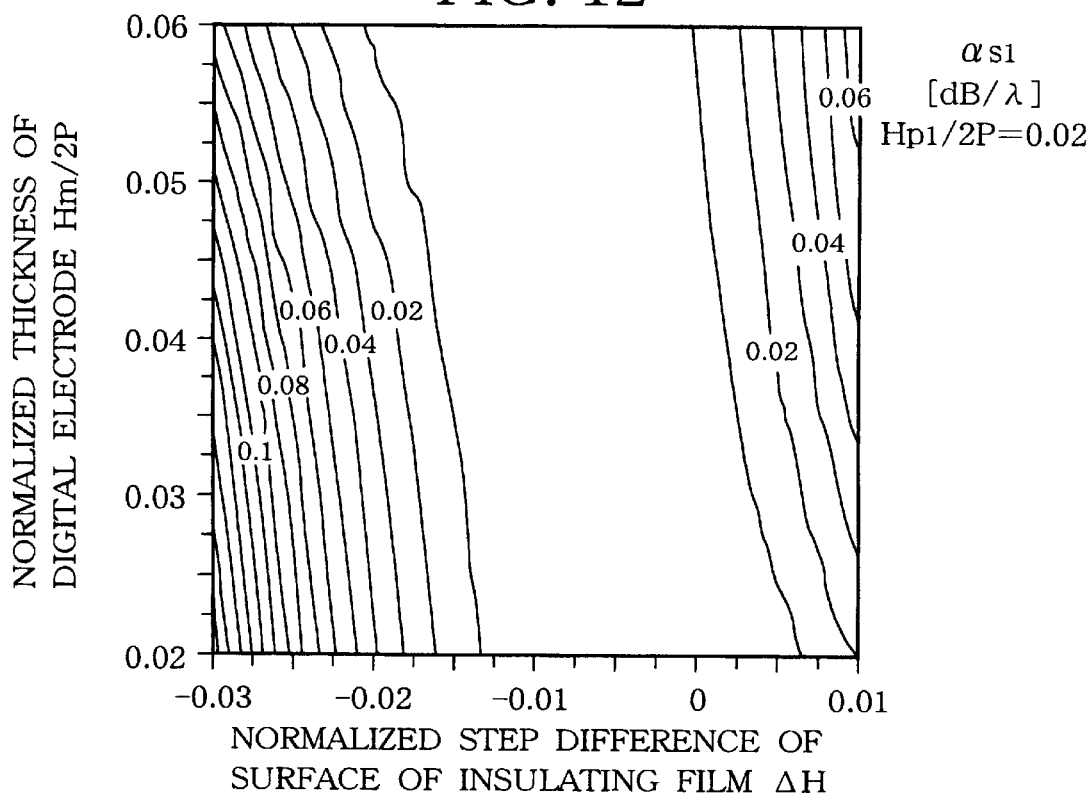
FIG. 12 is a graph of numerical simulation results of a propagation loss αs1 at the stop band edges in a case that the insulating film thickness Hp1/2P=0.02.
Figure 13:
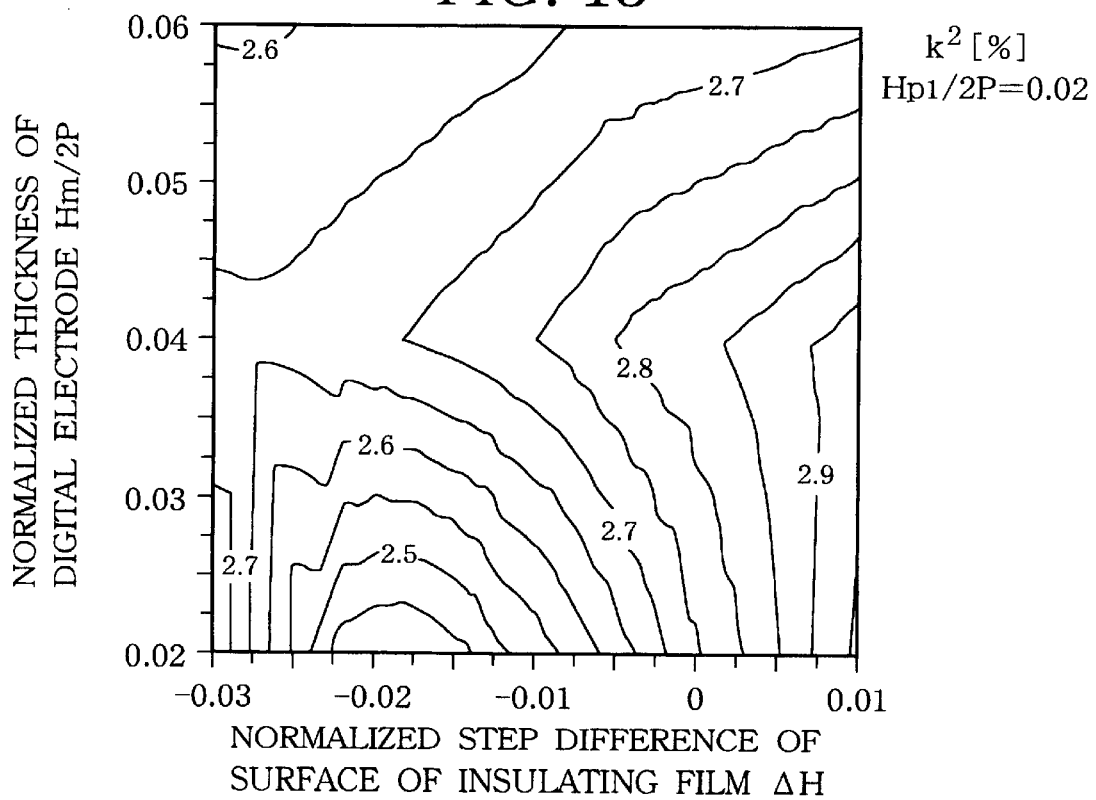
FIG. 13 is a graph of numerical simulation results of electromechanical factors $k^2$ in a case that the insulating film thickness Hp1/2P=0.02.
Figure 14:
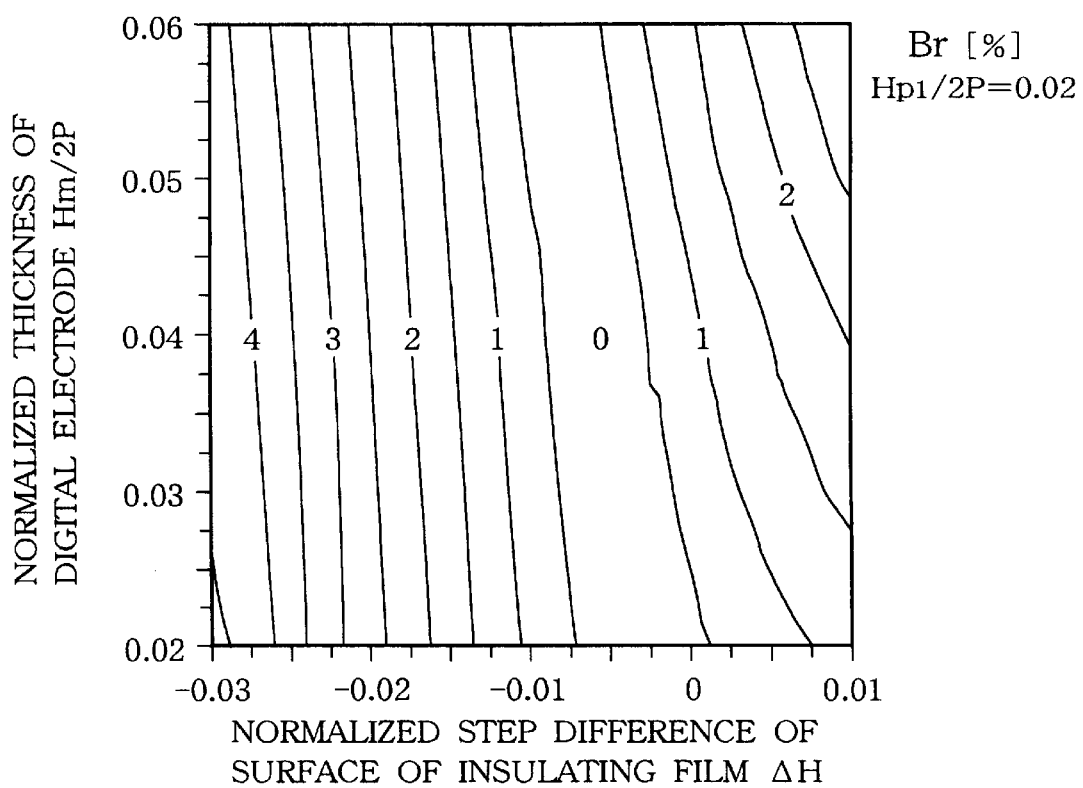
FIG. 14 is a graph of numerical simulation results of susceptances Br indicative of unidirection in a case that the insulating film thickness Hp1/2P=0.02.
Figure 15:
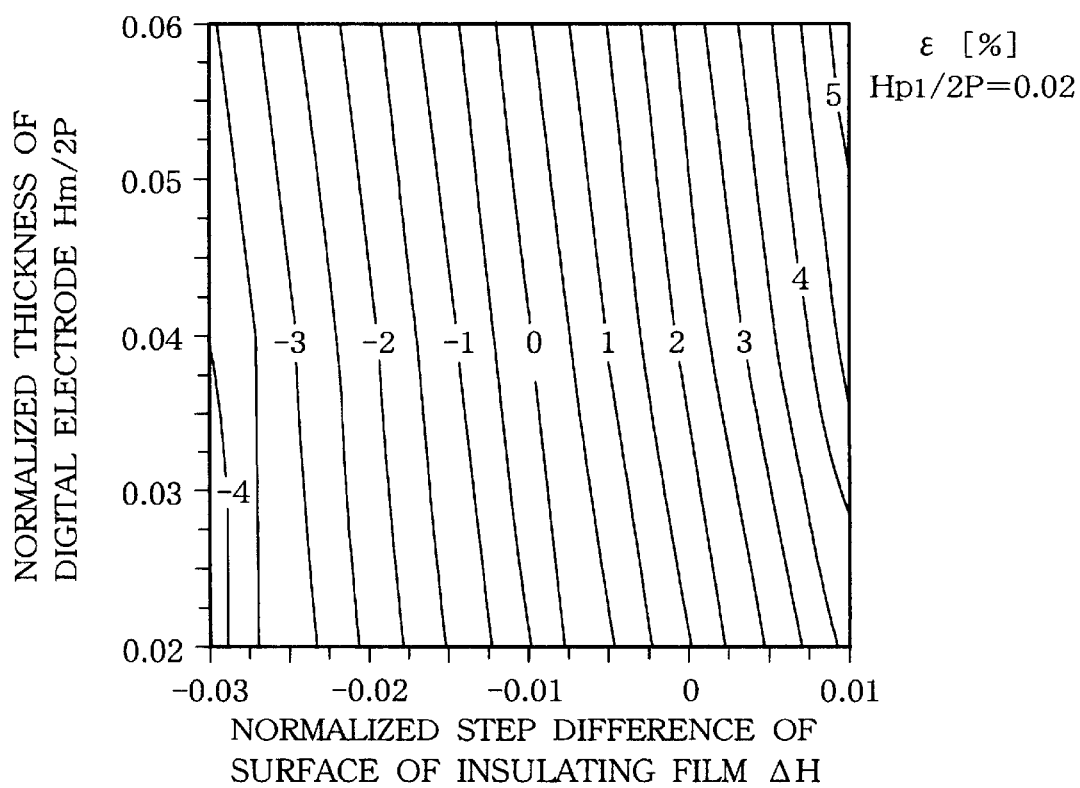
FIG. 15 is a graph of numerical simulation results of acoustic impedance mismatches ε in a case that the insulating film thickness Hp1/2P=0.02.
Figure 16:
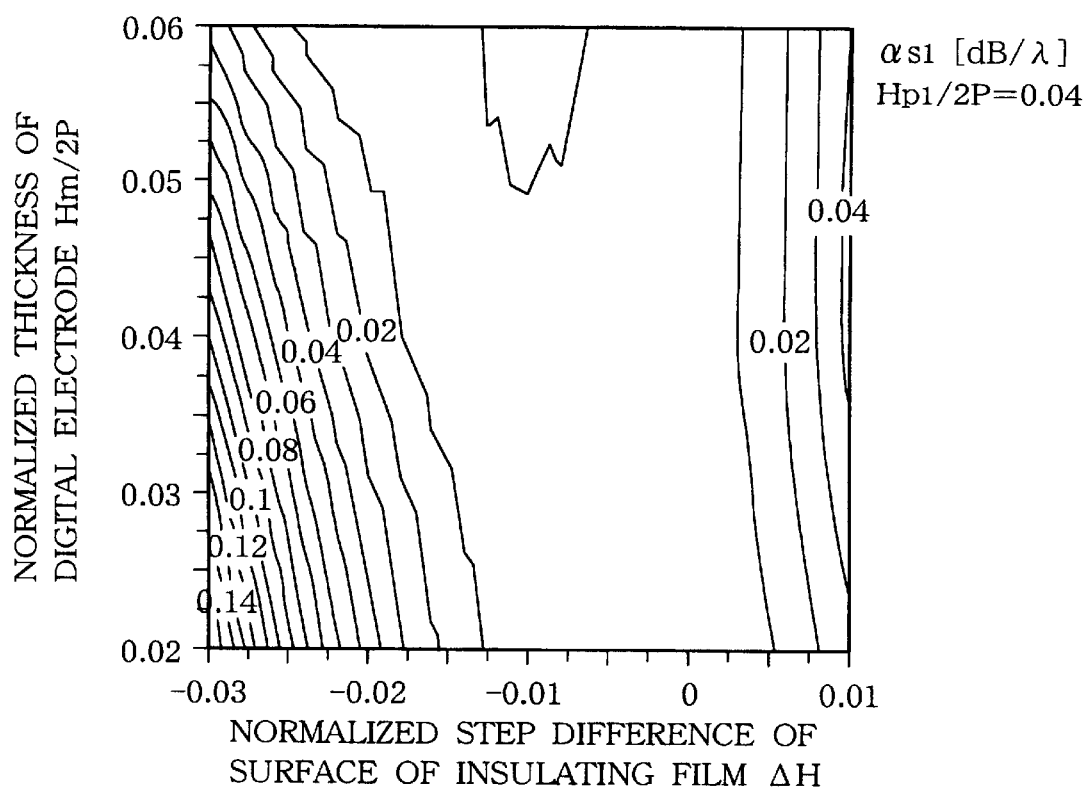
FIG. 16 is a graph of numerical simulation results of a propagation loss αs1 at the stop band edges in a case that the insulating film thickness Hp1/2P=0.04.
Figure 17:
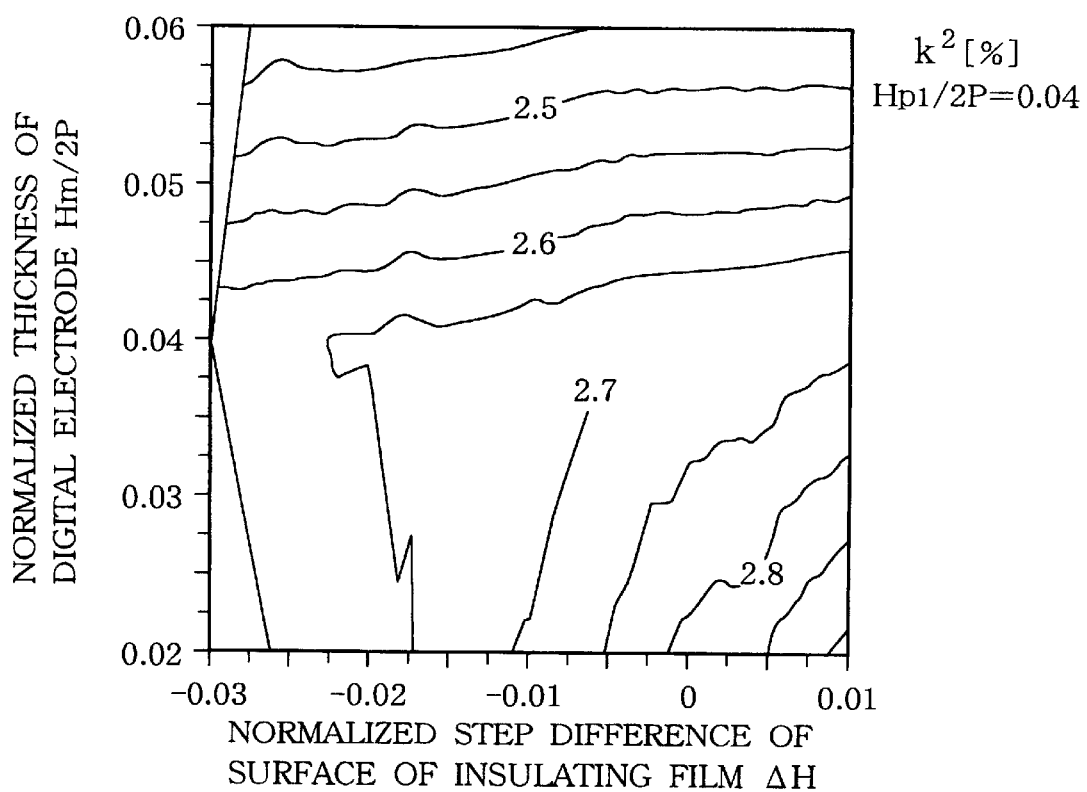
FIG. 17 is a graph of numerical simulation results of electromechanical factors $k^2$ in a case that the insulating film thickness Hp1/2P=0.04.
Figure 18:
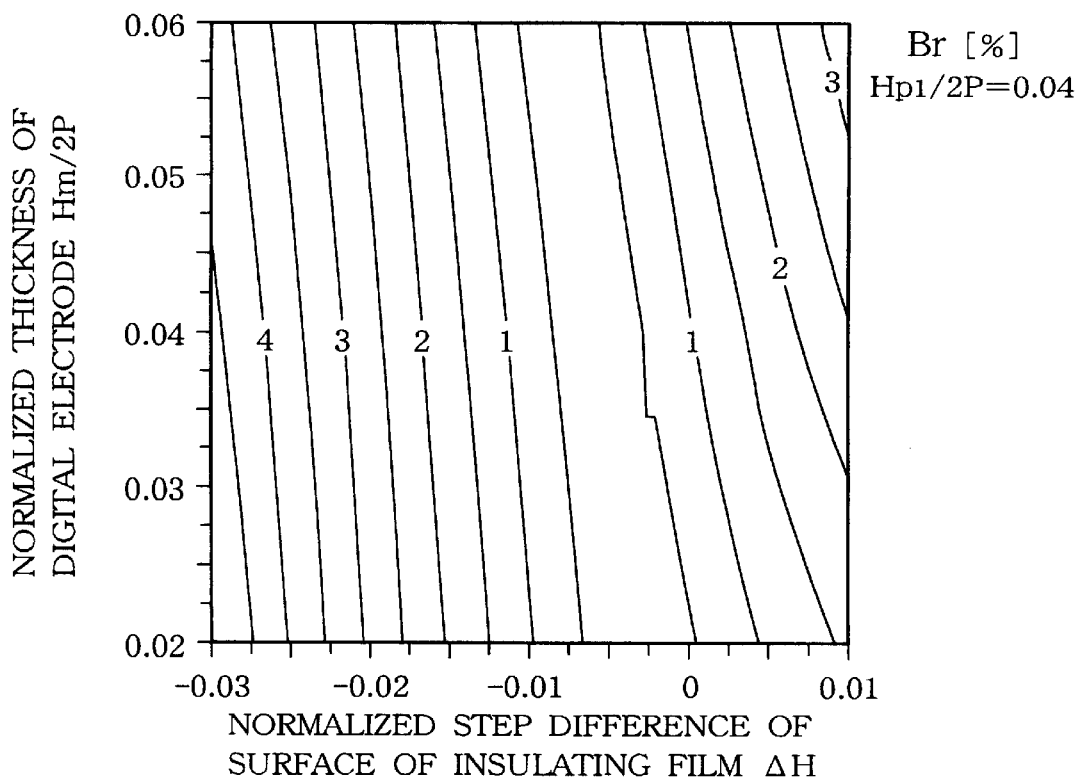
FIG. 18 is a graph of numerical simulation results of susceptances Br indicative of unidirection in a case that the insulating film thickness Hp1/2P=0.04.
Figure 19:
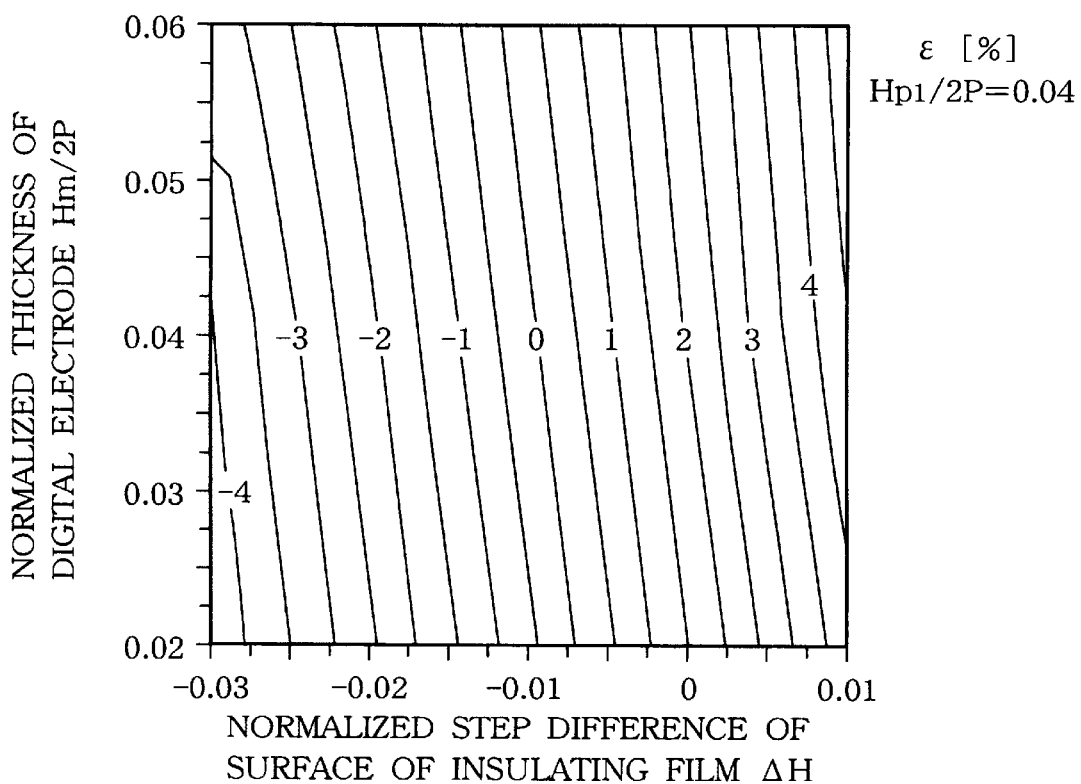
FIG. 19 is a graph of numerical simulation results of acoustic impedance mismatches ε in a case that the insulating film thickness Hp1/2P=0.04.
Figure 20:
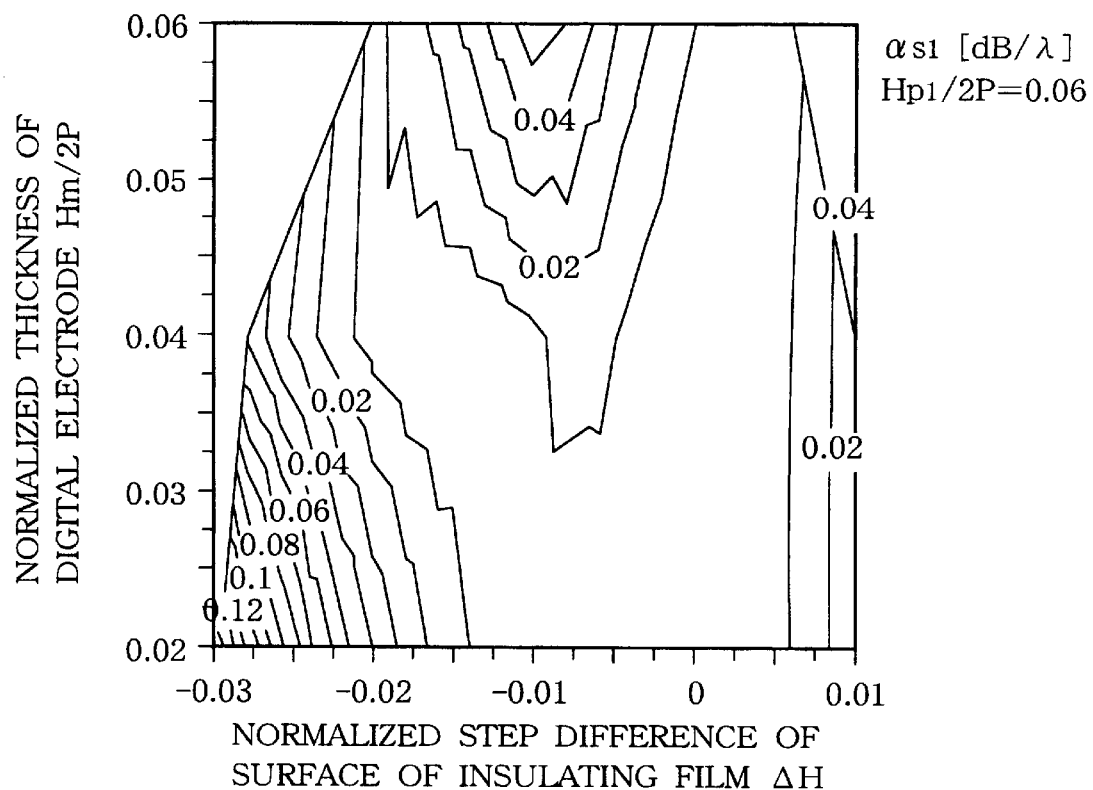
FIG. 20 is a graph of numerical simulation results of a propagation loss αs1 at the stop band edges in a case that the insulating film thickness Hp1/2P=0.06.
Figure 21:
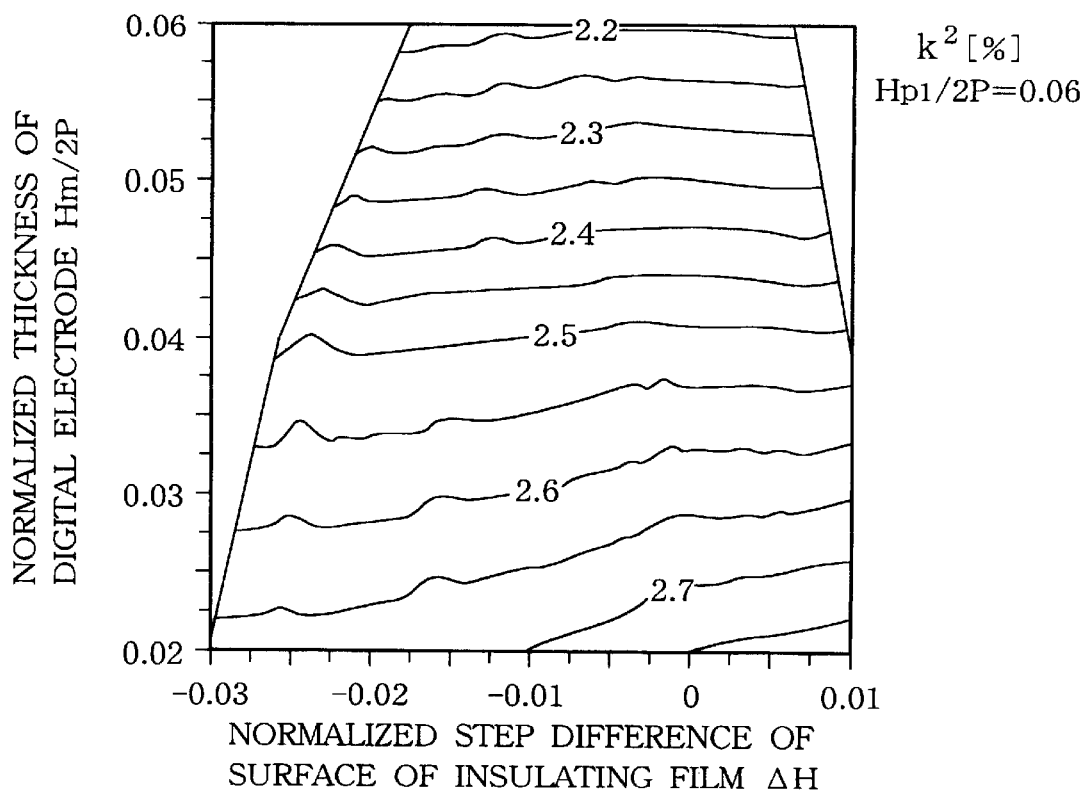
FIG. 21 is a graph of numerical simulation results of electromechanical factors $k^2$ in a case that the insulating film thickness Hp1/2P=0.06.
Figure 22:
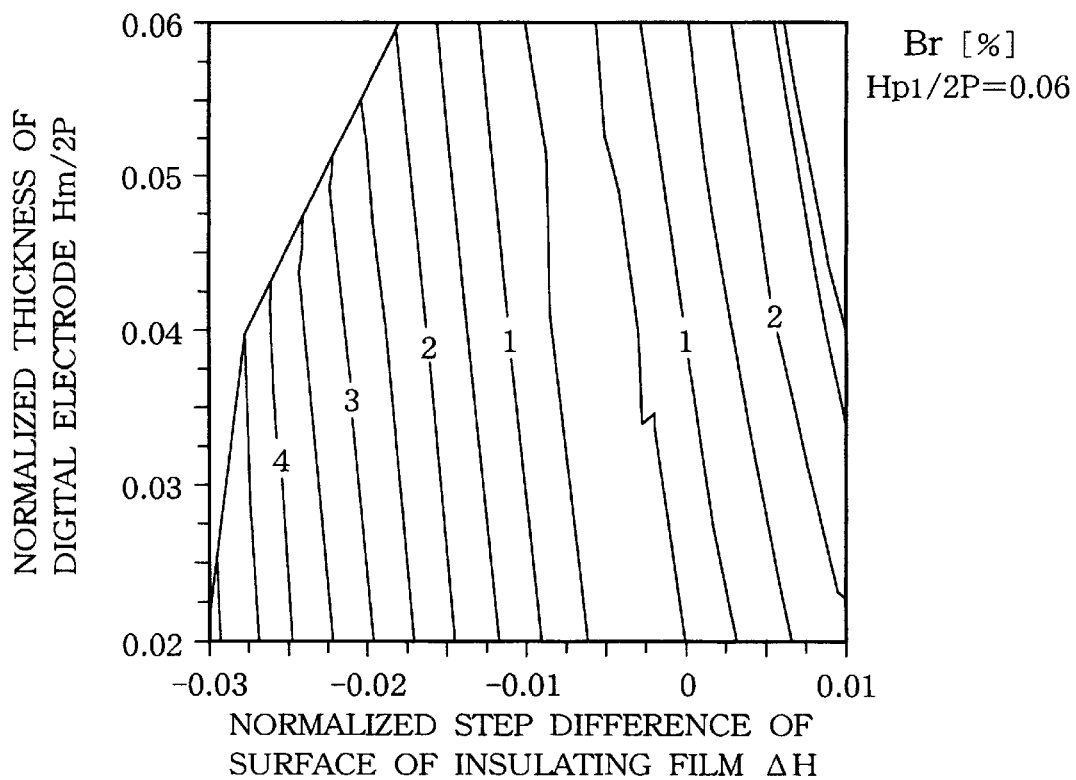
FIG. 22 is a graph of numerical simulation results of susceptances Br indicative of unidirection in a case that the insulating film thickness Hp1/2P=0.06.
Figure 23:
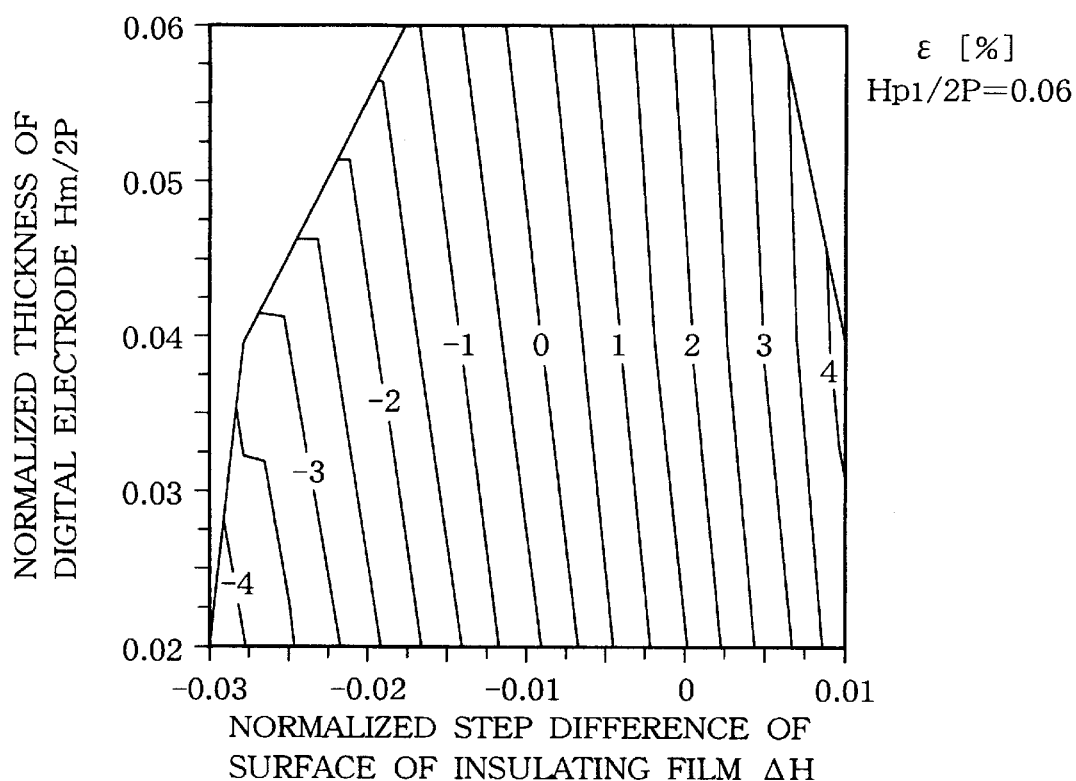
FIG. 23 is a graph of numerical simulation results of acoustic impedance mismatches ε in a case that the insulating film thickness Hp1/2P=0.06.

The inventors of the present application used the computation model of the electrode structure shown in FIG. 7 and gave an optimum electrode structure which can decrease propagation loss by numerical simulation.

In the electrode structure of FIG. 7, electrodes 12 are formed on the surface of a piezoelectric substrate 10 at a pitch P, and an insulating film 18 is formed thereon. The insulating film 18 has different thickness values between the portions on the electrodes 12 and the portions on the piezoelectric substrate 10. The simulation improved the method for forming the above-described single electrode IDT. In addition to the above-described Formulas 1 to 4, the following Formulas 7 and 8 were used to consider displacements and potentials in respective directions in the insulating film 18.

$$U_i^{film} = \sum_{m=-\infty}^{\infty} \sum_{n=11}^{18} A^{(m,n)} \times \beta_i^{(m,n)} \times \exp j\left\{\kappa\alpha^{(m,n)}X_3 - \left(\kappa + \frac{2mP}{\pi}X_1 + \omega t\right)\right\}$$ Formula 7

$$\Phi^{film} = \sum_{m=-\infty}^{\infty} \sum_{n=11}^{18} A^{(m,n)} \times \beta_4^{(m,n)} \times \exp j\left\{\kappa\alpha^{(m,n)}X_3 - \left(\kappa + \frac{2mP}{\pi}X_1 + \omega t\right)\right\}$$ Formula 8

As in the above-described method, by satisfying the boundary conditions obtained by using Formulas 1 to 4 and Formulas 7 and 8, frequency dispersion characteristics of a propagation coefficient κ can be given. As in the above-described method, based on the thus given dispersion characteristics, the parameters necessary for the design were given. Conditions were as follows: the surface acoustic waves were longitudinal leaky surface waves; the piezoelectric substrate was lithium tetraborate single crystal; the electrodes were arranged so that cut angles and propagation directions of the surface acoustic waves were an Eulerian angle representation of (0°, 47.3°, 90°); the electrodes were formed of aluminium; and the insulating film was formed of silicon dioxide.

Next the result of the simulation will be explained.

FIGS. 8 to 11 respectively show propagation losses αs1 at the edge of stop band, electromechanical coupling factors $k^2$, susceptances Br indicative of unidirection, and acoustic impedance mismatches ε at stop band edges in a case that a thickness Hp1/2P of the insulating film 18 on the electrodes 12 is 0, the thickness Hp1/2P being normalized by 2P (twice a electrode pitch P). Step differences of the surface of the normalized insulating film 18 ΔH (=(Hm+Hp1−Hp2)/(2P)) are taken on the horizontal axis, and normalized thicknesses Hm/2P of the electrodes are taken on the vertical axis.

FIGS. 12 to 15 respectively show propagation losses αs1 at the edge of stop band, electromechanical coupling factors $k^2$, susceptances Br indicative of unidirection, and acoustic impedance mismatches ε at stop band edges in a case that a thickness Hp1/2P of the insulating film 18 on the electrodes 12 is 0.02, the thickness Hp1/2P being normalized by 2P (twice a electrode pitch P).

FIGS. 16 to 19 respectively show propagation losses αs1 at the edge of stop band, electromechanical coupling factors $k^2$, susceptances Br indicative of unidirection, and acoustic impedance mismatches ε at stop band edges in a case that a thickness Hp1/2P of the insulating film 18 on the electrodes 12 is 0.04, the thickness Hp1/P being normalized by 2P (twice a electrode pitch P).

FIGS. 20 to 23 respectively show propagation losses αs1 at the edge of stop band, electromechanical coupling factors $k^2$, susceptances Br indicative of unidirection, and acoustic impedance mismatches ε at stop band edges in a case that a thickness Hp1/2P of the insulating film 18 on the electrodes 12 is 0.06, the thickness Hp1/P being normalized by 2P (twice a electrode pitch P).

The propagation losses αs1 at the stop band edge, which are indicative of characteristics of propagation loss by the IDT of an actual surface acoustic wave device greatly depend on a step difference ΔH of the surface of the insulating film 18.

It is found that in a case that a thickness Hm/2P of the electrodes 12 and a thickness Hp1/2P of the insulating film 18 on the electrodes 12 are relatively large, e.g., respectively up to about 6%, a propagation loss αs1 at the stop band edge is not much influenced by the thickness Hm/2P of the electrodes 12 nor the thickness Hp1/2P of the insulating film 18 on the electrodes 12.

It is found that, in this range, a propagation loss can be below 0.02 dB/k when a step difference ΔH of the surface of the insulating film 18 is above −0.03 and below 0.01.

It is found that, in this range, a propagation loss can be below 0.02 dB/k even when a thickness Hm/2P of the electrodes 12 is relatively large, in a case that an absolute value of an acoustic impedance mismatch ε is below 3%, and that acoustic impedances between the parts where the electrodes 12 are present and the parts where the electrodes 12 are absent are made substantially equal to each other.

It is found that a range where a propagation loss can be below 0.02 dB/λ is larger in the case that the insulating film 18 is present on the electrodes 12 than in the case (Hp1/2P=0) that the insulating film 18 is absent on the electrodes 12.

Furthermore, an acoustic impedance mismatch ε is made sufficiently low, down to below ±0.5%, whereby frequency resonance deformation due to multipath reflection in the electrodes 12 can be reduced.

A normalized step difference ΔH (=(Hm+Hp1−Hp2)/(2P)) of the surface of the insulating film 18 in this range a little depends on a thickness Hm/(2P) of the electrodes 12 and preferably is set in a range satisfying the following expression.

$$-0.108 \times Hm/(2P) - 8.5 \times 10^{-3} \leq (Hm+Hp1-Hp2)/(2P) \leq -0.150 \times Hm/(2P) - 1.0 \times 10^{-3}$$

In addition, in designing a surface acoustic wave device, it is often necessary that a susceptance Br indicative of unidirection of an array of the electrodes has a sufficiently small value.

In such case, a normalized step difference ΔH (=(Hm+Hp1−Hp2)/2P) of the surface of the insulating film 18 in the range where a propagation loss is sufficiently low, and a susceptance Br indicative of unidirection is sufficiently low, e.g., below ±0.5% does not substantially depend on a thickness Hp1/2P of the insulating film 18 on the electrodes 12 and preferably is set in a range satisfying the following expression.

$$-0.09 \times Hm/(2P) - 6.6 \times 10^{-3} \leq (Hm + Hp1 - Hp2)/(2P) \leq -0.24 \times Hm/(2P) + 9.1 \times 10^{-3}$$

In the above range, an electromechanical factor $k^2$ is a sufficient value of 2.5–3.0%, and it is found that temperature characteristics are good.

Figure 24:
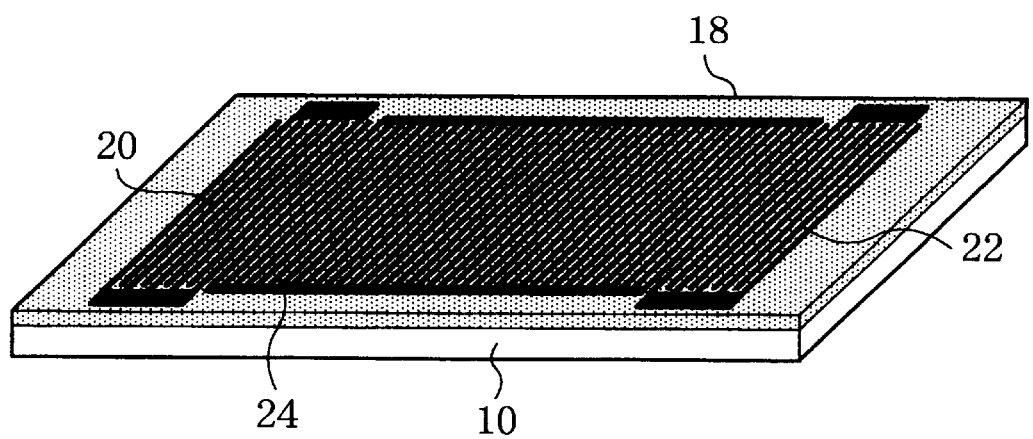
FIG. 24 is a view explaining a structure in a surface acoustic wave device according to an embodiment of the present invention.

A structure of the surface acoustic wave device according to one embodiment of the present invention is shown in FIG. 24. This surface acoustic wave device is a transversal filter comprising an input IDT 20 and an output IDT 22 which are formed of inter-digital electrodes of a λ/4 electrode line width formed on a piezoelectric substrate 10 of lithium tetraborate of (011) principal plane, and short strips 24 formed in a propagation region between the input IDT 20 and the output IDT 22 at the same pitch and aperture length as the input IDT 20 and the output IDT 22.

The input IDT 20 and the output IDT 22 have the same structure, and have 20.5 pairs of electrodes, a 4 μm electrode pitch (electrode width: 2 μm, wavelength: 8 μm) and a 400 μm aperture length, and are so formed that propagation directions of surface acoustic waves are an Eulerian angle representation of (0°, 47.3°, 90°).

The input IDT 20, the output IDT 22 and the short strips 24 are formed of aluminium (Al) of a 200 nm-thickness, and their normalized film thickness is 2.5% (Hm=0.025).

An insulating film 18 of a 200 nm-thick silicon dioxide (SiO$_2$) film is formed between the electrodes of the input IDT 20 and the output IDT 22, and the electrodes of the short strip 24. The insulating film 18 is left very thin on the electrodes of the input IDT 20 and the output IDT 22 for prevention of electrical short between the electrodes and improvement of reliability. Accordingly, Hp2/2P=0.025 and Hp1/2P≈0.

Figure 25:
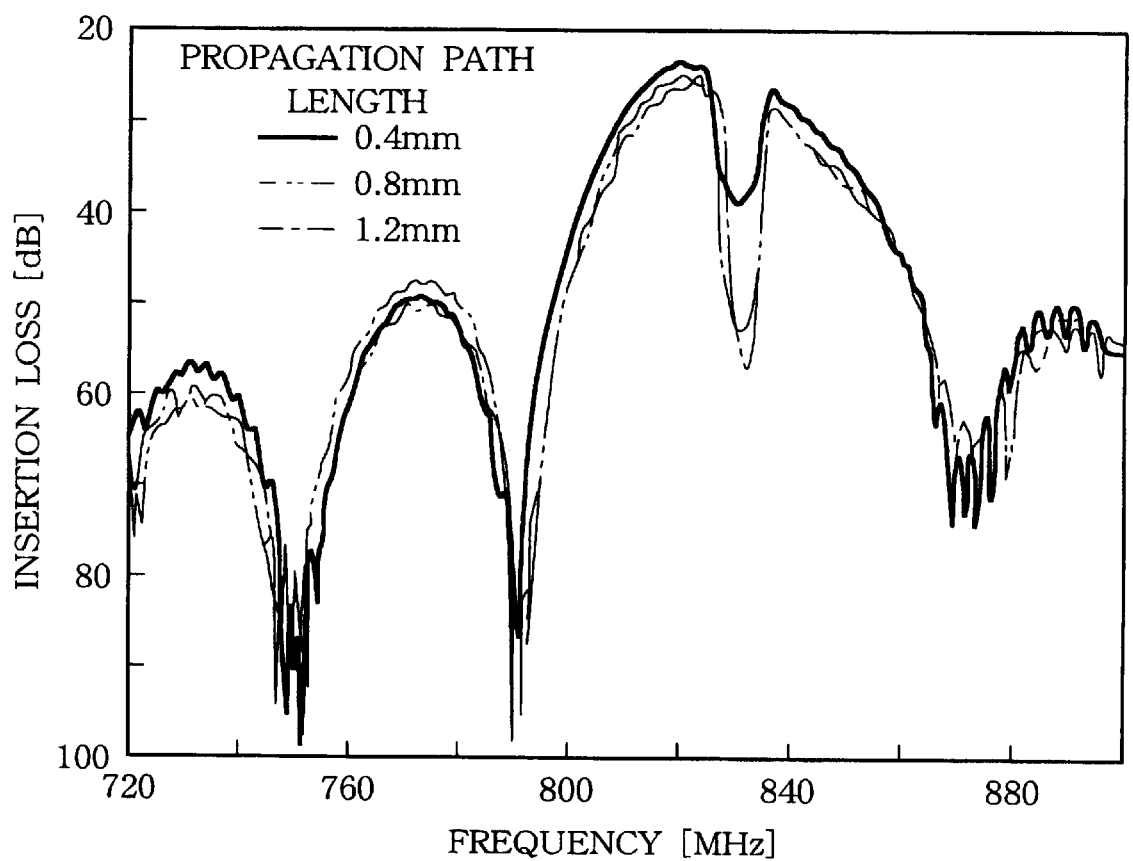
FIG. 25 is a graph showing passing frequency characteristics of the respective propagation paths of a surface acoustic wave device according to an embodiment of the present invention.

FIG. 25 shows frequency responses of the respective propagation paths of the short strip 24 of a 0.4 mm length, 0.8 mm length and 1.2 mm length. According to the present embodiment it is found that a minimum insertion loss does not substantially vary even with varied propagation lengths, and a propagation loss is as good as below 0.02 dB/λ.

As a control, frequency responses were measured on a surface acoustic wave device which does not include the insulating film 18 between the electrodes of the input IDT 20 and the output IDT 22, and the electrodes of the short strip 24, and includes the input IDT 20, the output IDT 22 and the short strip 24 formed of aluminium (Al) of a 160 nm-thickness and has the same structure as the present embodiment in the other respects. In this control, Hm/2P= 0.02, and Hp1/2P=Hp2/2P=0.

Figure 26:
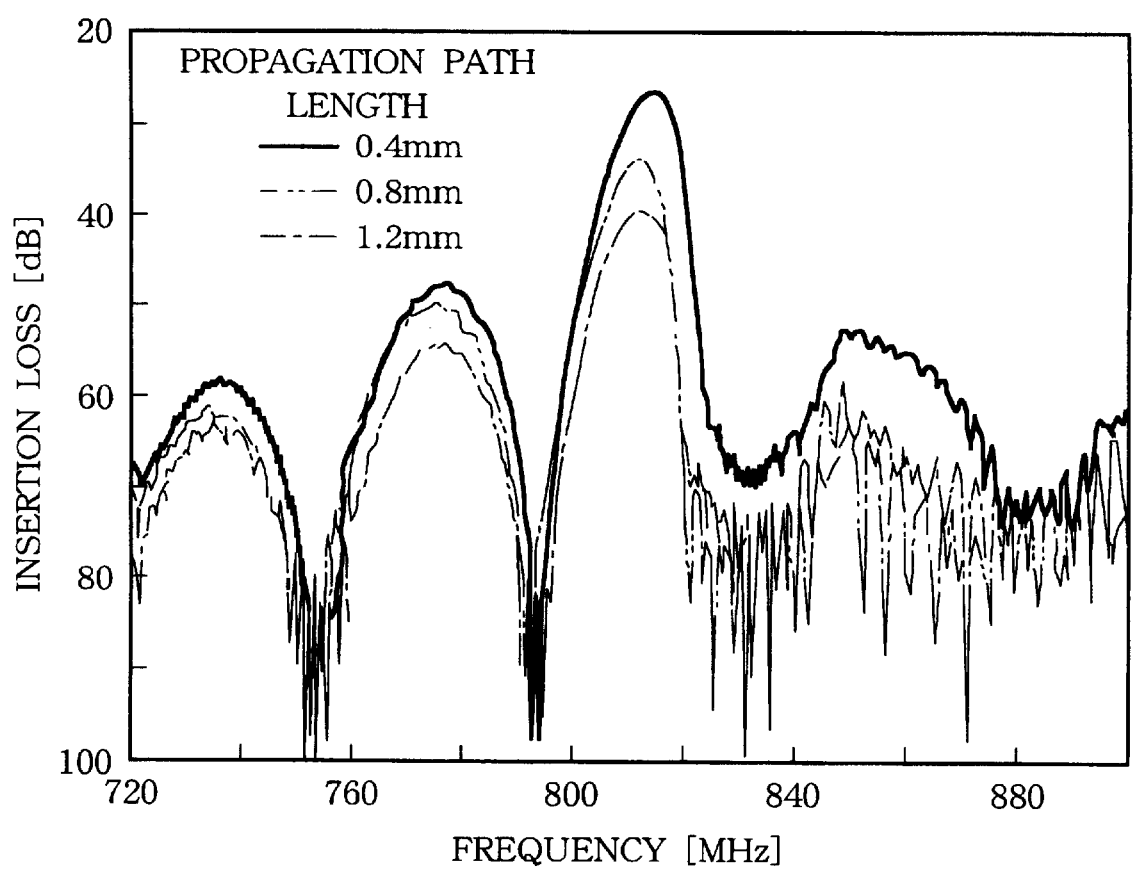
FIG. 26 is a graph showing frequency responses of the respective propagation paths of a control of a surface acoustic wave device.

FIG. 26 shows frequency responses of the respective propagation paths of the short strip 24 of a 0.4 mm length, 0.8 mm length and 12 mm length. According to this control, it is found that a minimum insertion loss much varies with varied propagation path lengths, and a propagation loss is above 0.1 dB/λ.

As described above, the surface acoustic wave device according to the present embodiment includes the piezoelectric substrate, and the electrodes of conducting film for exciting, receiving, reflecting and/or propagating surface acoustic waves on the piezoelectric substrate, whereby the surface acoustic waves propagate on the surface of the piezoelectric substrate, radiating at least one transversal wave component of bulk waves in the direction of depth of the piezoelectric substrate, and acoustic impedances with respect to the surface acoustic waves in the regions of the electrodes with the conducting film and in the regions of the electrodes without the conducting film are substantially equal to each other. As a result, a surface acoustic wave device for processing of signals of relatively high frequencies, such as above 1 GHz, by the use of surface acoustic waves, such as longitudinal leaky surface waves, which propagate, radiating bulk waves in the direction of depth of the piezoelectric substrate can include an electrode structure without increased propagation losses and with sufficiently low electric resistances. Such a surface acoustic wave device is sufficiently applicable to requirements for higher frequency operation.

Next, a method for fabricating the surface acoustic wave device according to the present embodiment will be explained with reference to FIGS. 27 to 29.

Figure 27A:
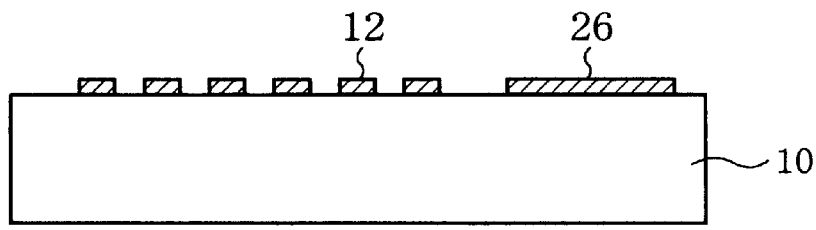
FIGS. 27A, 27B, 27C and 27D are sectional views of the surface acoustic wave device in the steps of a method for fabricating the same according to an embodiment of the present invention.

As the piezoelectric substrate 10, a substrate of lithium tetraborate single crystal of (011) cut is used. As shown in FIG. 27A, a 0.14 μm-thickness pure aluminium film is formed as the conducting film by vacuum deposition on the entire surface of the piezoelectric substrate 10. Then, the conducting film 12 is etched with a mask of a photoresist (not shown) which is patterned so that surface acoustic waves have 90° X-propagation, and the IDTs are formed. At this time, a monitor unit 26 for monitoring film thickness, bonding pads (not shown), etc. is patterned in regions other than the IDTs. The conducting film 12 is etched with an above PH 10 alkaline etchant for prohibiting etching of the lithium tetraborate substrate 10.

The IDTs have a 1 μm electrode width, a 2 μm electrode pitch, a 4 μm IDT pitch, a 200 μm aperture length and 20.5 pairs of electrodes, and the two IDTs are arranged so that surface acoustic waves propagate in 90° X propagation direction. The cut angle of the substrate and the propagation directions of surface waves are an Eulerian angle representation of (0°, 47.3°, 90°).

Figure 27B:
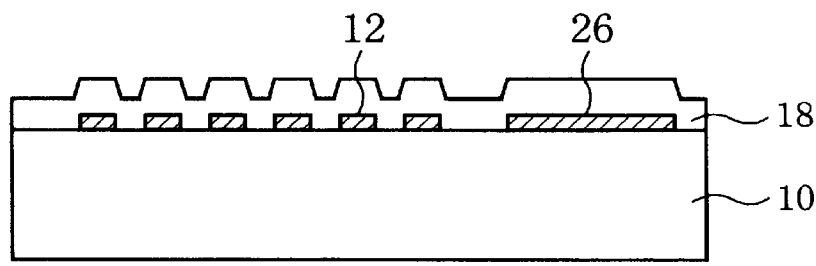

Next, as shown in FIG. 27B, an SiO$_2$ film 18 as the insulating film is formed on the surface of the piezoelectric substrate 10 with the conducting film 12, the monitor unit 26 for monitoring a film thickness, etc. formed on. The SiO$_2$ film 18 is formed in a 0.43 μm thickness by sputtering. Because the thicknesses of the conducting film 12 and the SiO$_2$ film 18 are sufficiently thin in comparison with the pitch of the electrodes, i.e., twice a width of the electrodes and is about ⅓, the thickness of the SiO$_2$ film 18 is substantially uniform over the entire surface and have, on the surface, steps which are substantially equal to the thickness of the conducting film 12.

Figure 27C:
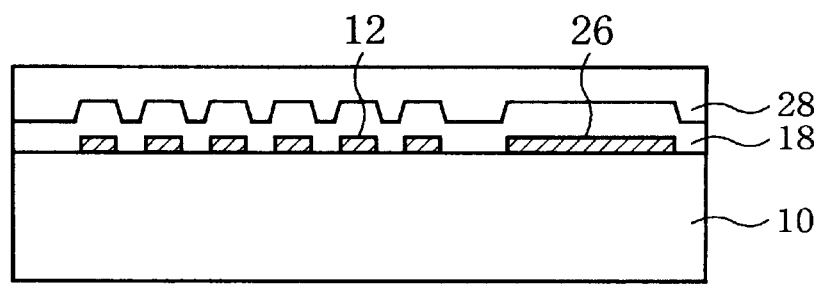

Next, as shown in FIG. 27C, a resist film 28 which is to be a planarization layer is formed on the SiO$_2$ film 18. The resist film 28 is formed by spin-coating a novolak resin-based resist (trade name "HPR-1183" by Fuji Hant Co.) and then baking the same at a temperature higher than a temperature for an etching step which will be described later, preferably above 150° C. The surface of the resist film 28 is sufficiently planarized even in consideration of the thickness of the conducting film 12 and is formed so that steps thereof are below 0.03 μm.

Figure 27D:
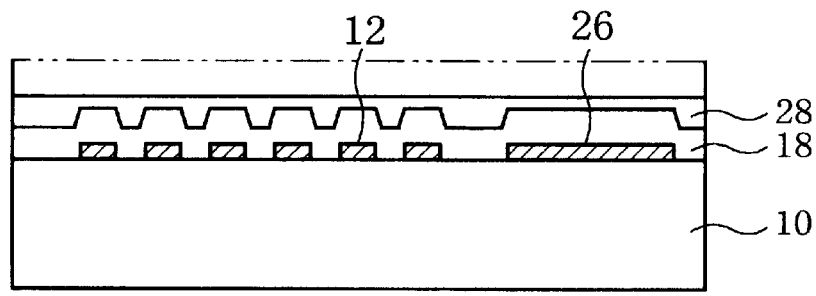

Next, as shown in FIG. 27D, etching is conducted through the resist film 28 so that the SiO$_2$ film 18 has different thicknesses between the regions with the conducting film 12 formed on and those with the conducting film 12 not formed on. The etching is dry etching using a parallel plate plasma etching apparatus. CF$_4$ is used at a 40 sccm flow rate, and an RF power is 100 W.

The etching rate varies on the resist film 28 and the SiO$_2$ film 18 and greatly depends on a gas pressure of the CF$_4$ gas.

Figure 28:
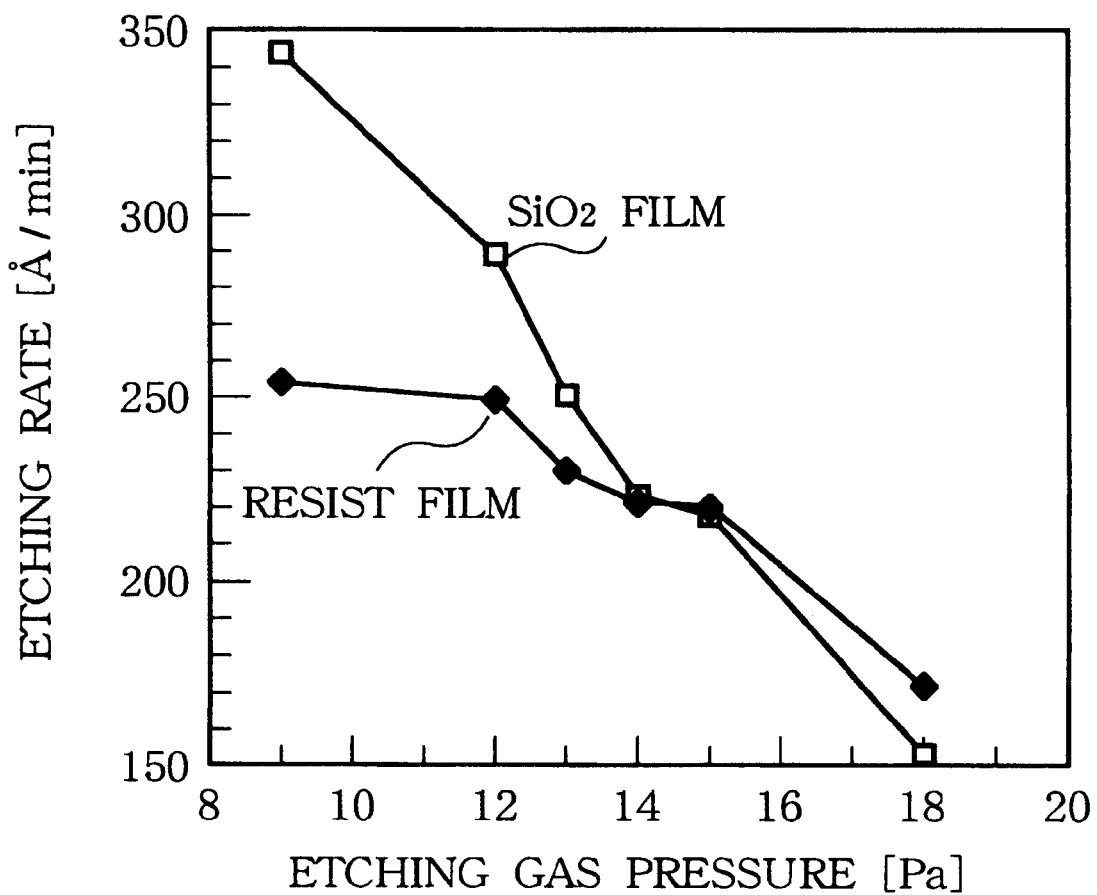
FIG. 28 is a graph showing the relationships between the pressures of the $CF_4$ gas in the dry etching and the etching rates of the resist film and the $SiO_2$ film.

FIG. 28 shows the relationships of the etching rate of the resist film 28 and the $SiO_2$ film, and the etching pressure. In the graph of FIG. 28, it is found that etching rate ratios Rr/Rs, which are ratios between etching rates Rr of the resist film 28 and etching rate Rs of the $SiO_2$ film, change.

In a case that the resist film 28 and the $SiO_2$ film 18 are concurrently etched, oxygen generated by etching the $SiO_2$ film accelerates etching rate of the resist film 28. So, the etching pressure is set at a lower pressure value than a computed pressure value.

When the etching is started, at first only the resist film 28 is etched until the resist film 28 left in the concavities in the $SiO_2$ film 18. As the etching further advances, either of the $SiO_2$ film 18 or the resist film 28 is more etched according to an etching rate ratio set by an etching pressure. As a result, different etching amounts occur between the regions with the conducting film 12 formed on and the regions with the conducting film 12 not formed, and steps are formed on the surface.

Figure 29A:
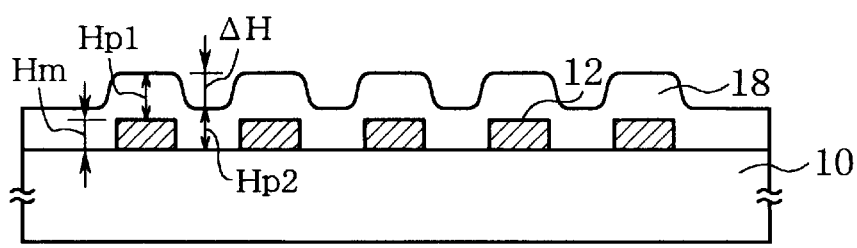
FIGS. 29A, 29B and 29C are sectional views of the surface acoustic wave devices fabricated by a method for fabricating the same according to an embodiment of the present invention.
Figure 29B:
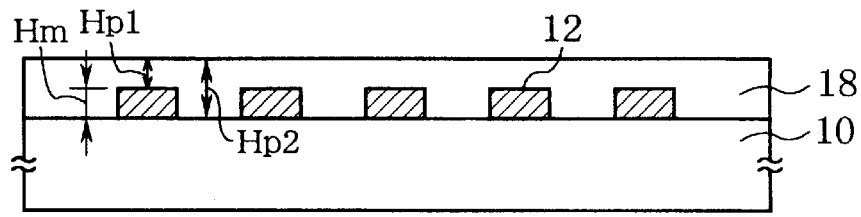
Figure 29C:
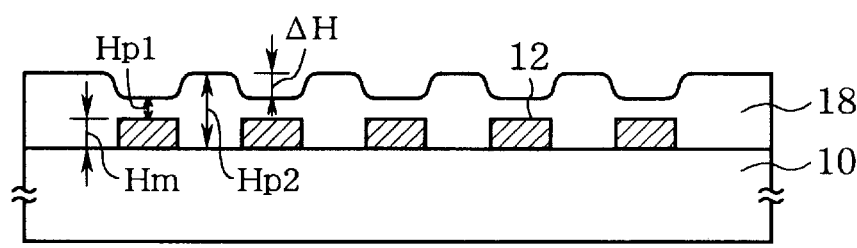

A step difference ΔH is defined by the following formula as shown in FIGS. 29A to C.

ΔH=Hm+Hp1−Hp2 where Hm represents a thickness of the conducting film 12, Hp1 represents a thickness of the $SiO_2$ film on the conducting film 12, and Hp2 represents a thickness of the $SiO_2$ film 18 on the regions of the piezoelectric substrate 10 where the conducting film 12 is not formed.

When the etching is finished at the time that all the resist film 28 has been etched off, a step difference ΔH is ΔH=Hm(1(Rs/Rr))

That is, a thickness of the resist film 28 left when the $SiO_2$ film 18 is exposed on the surface corresponds to a thickness Hm of the conducting film 12, and a period of time from this time till the remaining resist film 28 has been all etched, is equal to Hm/Rr. In this period of time the $SiO_2$ film 18 is concurrently etched. Accordingly a step difference ΔH has the above-described relationship, based on a product of an etching rate difference (Rr-Rs) and an etching time Hm/Rr.

FIG. 29C shows the result of the etching with an etching rate ratio (Rr/Rs) of below 1. FIG. 29B shows the result of the etching with an etching rate ratio (Rr/Rs) of substantially 1. FIG. 29A shows the result of the etching with an etching ratio (Rr/Rs) of above 1.

With Rr/Rs being below 1 exclusive of 1, the $SiO_2$ film 18 is left in concavities above the conducting film 12. With Rr/Rs being substantially equal to 1, the surface f the $SiO_2$ film 18 is flat. With Rr/Rs being above 1, the $SiO_2$ film 18 is left in convexities above the conducting film 12.

It is found that the etching rate ratio (Rr/Rs) is thus adjusted, whereby the $SiO_2$ film 18 can be controlled to have required thicknesses at the regions without the conducting film 12 and the regions with the conducting film 12.

In the present embodiment, the $SiO_2$ film 18 was dry-etched at 5 Pa etching pressure, an 8 Pa etching pressure and a 10 Pa etching pressure while thicknesses of the $SiO_2$ film left on the monitor unit 26 being optically measured by a laser interferometer, and the etching was finished when the $SiO_2$ film thereon had a 0.1 μm thickness When an etching pressure is 5 Pa, an etching rate ratio (Rr/Rs) is about 0.7. As shown in FIG. 29A, the $SiO_2$ film 18 is concave in the regions without the conducting film 12, and a step difference ΔH was −21.1 nm, i.e., negative.

When an etching pressure is 8 Pa, an etching rate ratio (Rr/Rs) is about 1.0. As shown in FIG. 29B, the $SiO_2$ film 18 had a flat surface irrespective of the presence of the conducting film 12, and step difference ΔH is 1.7 nm, i.e., substantially zero.

When an etching pressure is 10 Pa, an etching rate ratio (Rr/Rs) is about 1.1. As shown in FIG. 29C, the $SiO_2$ film 18 is convex above the conducting film 12, and a step difference ΔH is 5.8 nm, i.e., positive.

Thus, by changing the etching pressure from 5 Pa to 10 Pa, the step difference ΔH can be controlled to be negative to positive. By the above-described monitoring method in which thicknesses of the $SiO_2$ film 18 above the monitor unit 26 are measured by the monitor unit 26 during the etching, a current thickness of the $SiO_2$ film 18 can be measured and controlled with high precision, whereby electric characteristics, such as center frequencies, of the surface acoustic wave device can have less deflections and can have improved reproducibility.

Next the $SiO_2$ film 18 on the bonding pads (not shown) are selectively etched and the surface acoustic wave device is completed after an assembling step of packaging.

Thus, according to the present embodiment, after the insulating film is formed on the entire inter-digital electrodes, a thickness of the insulating film is different between the parts thereof on the piezoelectric substrate and the parts thereof above the conducting films, whereby mass discontinuity in the IDTs of the micronized structure can be reduced by the simple fabrication process. Accordingly frequency response deformation of surface acoustic waves is kept low, whereby the surface acoustic wave device can have better characteristics by this simple process.

A method for fabricating the surface acoustic wave device according to another embodiment of the present invention will be explained with reference to FIGS. 30 and 31.

Figure 30A:
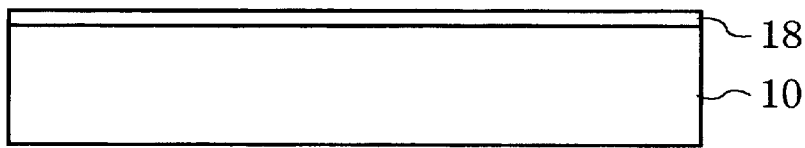
FIGS. 30A, 30B, 30C, 30D and 30E are sectional views of the surface acoustic wave device in the steps of a method for fabricating the same according to another embodiment of the present invention.

As the piezoelectric substrate 10, a substrate of lithium tetraborate single crystal of (011) cut is used. As shown in FIG. 30A, a 0.1 μm-thickness $SiO_2$ film 18 is formed as an insulating film on the entire surface of the piezoelectric substrate 10 by sputtering. Other silicon oxide films, such as $SiO_x(X≈1)$, can be also used as the insulating film.

Figure 30B:
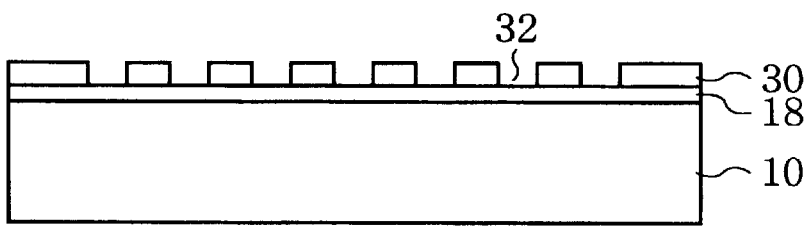

Then, as shown in FIG. 30B, a resist film 30 which is to be a mask is formed on the $SiO_2$ film 18. This resist film 30 has a 1.4 μm-thickness and openings 32 in the shape of an intended IDT pattern. To form the openings 32 with high precision, the resist film 30 is formed of a novolac resin-based resist (trade name "HPR-1183" by Fuji Hant Co.) having high resolution. The IDTs have a 1 μm electrode width, a 2 μm electrode pitch, a 4 μm IDT pitch, a 200 μm aperture length and 20.5 pairs of electrodes, and the two IDTs are arranged so that surface acoustic waves propagate in 90° X-propagation. The cut angle of the substrate and the propagation directions of surface waves are an Eulerian angle representation of (0°, 47.3°, 90°).

Figure 30C:
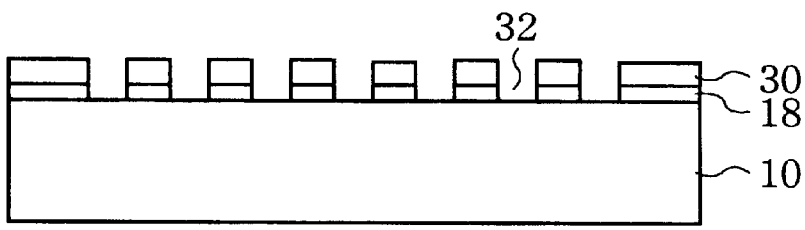

Next, as shown in FIG. 30C, with the resist film 30 as the mask, the $SiO_2$ film on the openings 32 is dry-etched. The dry-etching was conducted with $CF_4$ as the etching gas by a parallel plate plasma etching apparatus An RF power was 150 W, and a gas pressure was 12 Pa. Under these conditions, an etching rate ratio between the lithium tetraborate of the piezoelectric substrate 10 and the $SiO_2$ film 18 is above 10. As a result, etching of the $SiO_2$ film 18 does not substantially damage the piezoelectric substrate 10, and the piezoelectric substrate 10 is not damaged.

Figure 31:
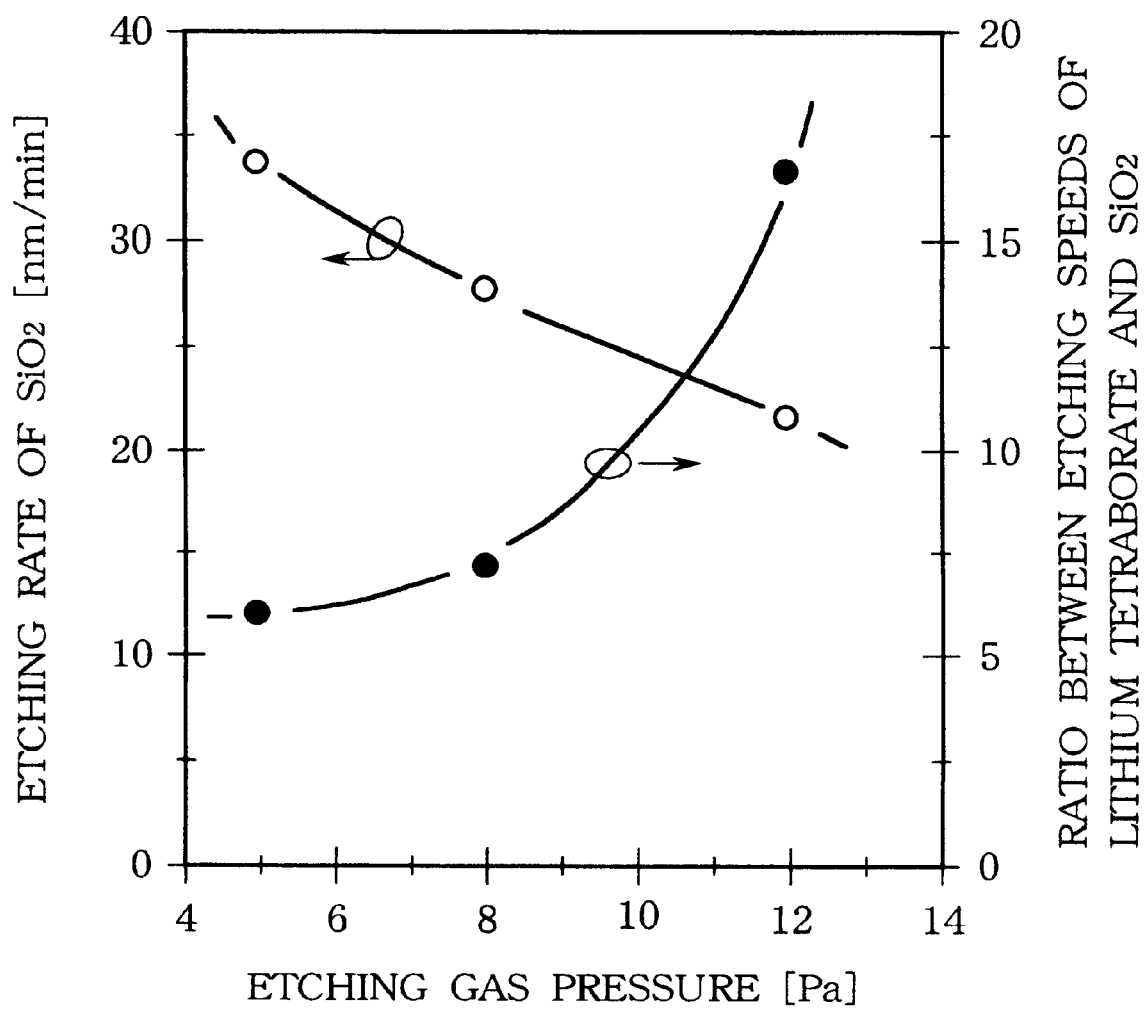
FIG. 31 is a graph showing the relationships between the pressures of the $CF_4$ gas in the dry etching and ratios of the etching rates of the $SiO_2$ film and the lithium tetraborate.

FIG. 31 shows etching rates the $SiO_2$ with different gas pressures of the etching gas, $CF_4$, and rate ratios between the lithium tetraborate and the $SiO_2$ with respect to the etching rates.

When an etching gas pressure is above 5 Pa, a rate ratio is above 5. A rate ratio is above 10 at a gas pressure of above 10 Pa. To decrease damage of the piezoelectric substrate 10, a rate ratio of above 5 is necessary, and a rate ratio of above 10 is preferable.

When an etching gas pressure exceeds 14 Pa, higher rate ratios can be obtained, but the etching rate of the SiO$_2$ is low, which lowers productivity.

As an etching gas, a carbon fluoride compound, such as CHF$_3$ other than CF$_4$ can be used. A gas, such as oxygen, nitrogen or others, may be added.

Figure 30D:
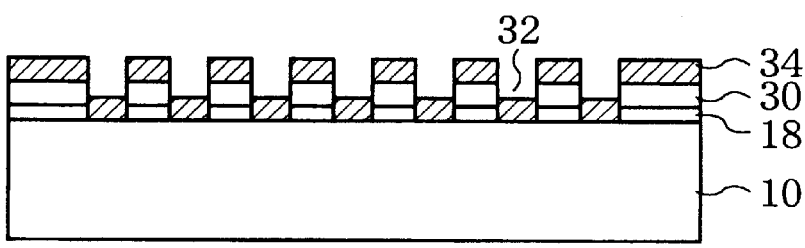
Figure 30E:
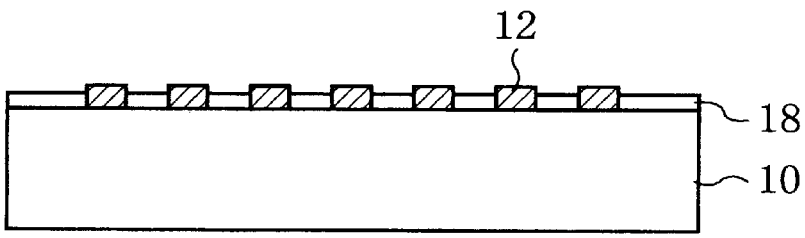

As shown in FIG. 30D, a 0.1 μm-thick aluminium film 34 is formed by vacuum deposition on the entire resist film 30 including the exposed openings 32 in the piezoelectric substrate 10.

Then, as shown in 30E, the conducting film 12 is lifted off into an IDT pattern. That is, when the resist film 30 is removed by a solvent, the aluminium film 34 on the resist film 30 is lifted off with the aluminium film 34 left only in the openings 32, and the conducting film 12 is formed in the IDT pattern.

The aluminium film 34 can be formed by sputtering or other techniques, but vacuum deposition is preferable because the aluminium film 34 can be easily removed by being lifted off.

Thus, according to the present embodiment, the insulating film and the conducting film are patterned by the use of one and the same mask, whereby no disalignment between the respective patterns takes place, and the respective patterns can be formed with good alignment In addition, thicknesses of the insulating film and the conducting film can be set independently of each other. As a result, the surface acoustic wave device has less mass interruption in the IDTs, can reduce propagation loss of surface acoustic waves, has better characteristics, and can be fabricated by this simple process.

The present invention is not limited to the above-described embodiments.

For example, in the above-described embodiments, a metal forming the IDTs, etc. is aluminium, but it is possible that Cu, Si, Co, or others is added to an extent that reduces stress migration. Oriented aluminium film may be used. Gold or other metals may be used.

In the above-described embodiments, SiO$_2$ film is used as the insulating film, but film of another inorganic compound, such as silicon nitride film, or others, may be used. Both films may be laid one on the other.

In the above-described embodiments, CF$_4$ is used as an etching gas, but carbon fluoride compounds, such as CHF$_3$, etc., may be used, and a gas, such as oxygen, nitride or others, may be added. In place of dry etching, wet etching may be used.

In the above-described embodiments, the present invention is applied to a transversal filter including an input IDT, an output IDT and a short strip. The short strip, however, may be absent in the propagation path, and a different form of electrode may be used. The present invention may be applied to, e.g., resonator-type filters including a electrodes between a pair of grating reflectors, resonators, a structure (IIDT structure) including a number of electrodes arranged parallel with each other, etc.

In said another embodiment, the present invention is applied to a filter including two IDTs, but may be applied to filters of other structures which include three or more IDTs, and include reflectors, etc., and to resonators, etc.

INDUSTRIAL APPLICABILITY

The present invention is suitable for surface acoustic wave devices comprising electrodes for exciting, receiving, reflecting and/or propagating surface acoustic waves disposed on piezoelectric substrate, and is useful especially as surface acoustic wave devices which use surface acoustic waves of high frequencies of above 1 GHz, such as leaky surface waves and longitudinal leaky surface waves. which, as a propagation mode, propagate radiating bulk waves in the direction of depth of the piezoelectric substrates.

We claim:

1. A surface acoustic wave device comprising:

a piezoelectric substrate;

an electrode formed of a conducting film formed on the piezoelectric substrate for exciting, receiving, reflecting and/or propagating surface acoustic waves; and an insulating film formed in a first region in the electrode where the conducting film is formed and in a second region in the electrode where the conducting film is not formed, the surface acoustic wave propagating on the surface radiating at least one transverse component of bulk waves in a direction of depth of the piezoelectric substrate, a thickness Hp1 (Hp1≧0) of the insulating film in the first region and a thickness Hp2(Hp2>0) of the insulating film in the second region being so set that the first region and the second region have substantially equal acoustic impedances with respect to the surface acoustic waves, wherein a step difference (Hm+Hp1−Hp2) of the surface of the insulating film at a b6undary between the first region and the second region satisfies the following formula:

−0.03≦(Hm+Hp1−Hp2)/λ≦0.01, where a thickness of the conducting film is represented by Hm, a thickness of the insulating film in the first region is represented by Hp1(Hp1≧0), a thickness of the insulating film in the second region is represented by Hp2 (Hp2>0), and a wavelength of the surface acoustic waves is represented by λ, wherein the piezoelectric substrate is a lithium tetraborate substrate, and wherein a cut angle of the surface of the piezoelectric substrate and a propagation direction of the surface acoustic waves are an Eulerian angle representation of (0°–45°, 38°–55°, 80°–90°) and in a range equivalent thereto.

2. A method for fabricating a surface acoustic wave device comprising:

forming a conducting film in a required pattern on a piezoelectric substrate to form an electrode for exciting, receiving, reflecting and/or propagating surface acoustic waves;

forming an insulating film in a first region in the electrode where the conducting film is formed and in a second region in the electrode where the conducting film is not formed; and setting a thickness Hp1(Hp1≧0) of the insulating film in the first region and a thickness Hp2(Hp2>0) of the insulating film in the second region so that the first region and the second region have substantially equal acoustic impedances with respect to the surface acoustic waves, providing a step difference (Hm+Hp1−Hp2) of the surface of the insulating film at a boundary between the first region and the second region satisfying the following formula:

−0.03≦(Hm+Hp1−Hp2)/λ≦0.01, where a thickness of the conducting film is represented by Hm, a thickness of the insulating film in the first region is represented by Hp1(Hp1≧0), a thickness of the insulating film in the second region is represented by Hp2(Hp2>0), and a wavelength of the surface acoustic waves is represented by λ, wherein the piezoelectric substrate is a lithium-tetraborate substrate, and wherein a cut angle of the surface of the piezoelectric substrate and a propagation direction of the surface acoustic waves are an Eulerian angle representation of (0°–45°, 38°–55°, 80°–90°) and in a range equivalent thereto.

3. A surface acoustic wave device comprising:

a piezoelectric substrate;

an electrode formed of a conducting film formed on the piezoelectric substrate for exciting, receiving, reflecting and/or propagating surface acoustic waves; and an insulating film formed in at least a first region in the electrode where the conducting film is formed and in a second region in the electrode where the conducting film is not formed, the surface acoustic wave propagating on the surface, radiating at least one transverse component of bulk waves in a direction of depth of the piezoelectric substrate, wherein a step difference (Hm+Hp1−Hp2)/(2P) of the surface of the insulating film normalized by 2P at a boundary between the first region and the second region satisfies the following formula:

$$-0.09 \times Hm/(2P) - 6.6 \times 10^{-3} \leq (Hm+Hp1-Hp2)/(2P) \leq -0.24 \times Hm/(2P) + 9.1 \times 10^{-3},$$

where a thickness of the conducting film is represented by Hm, a thickness of the insulating film in the first region is represented by Hp1(Hp1≧0), a thickness of the insulating film in the second region is represented by Hp2(Hp2>0), and a pitch of electrodes of the conducting film in the electrode is represented by P.

4. A surface acoustic wave device comprising:

a piezoelectric substrate;

an electrode formed of a conducting film formed on the piezoelectric substrate for exciting, receiving, reflecting and/or propagating surface acoustic waves; and an insulating film formed in a first region in the electrode where the conducting film is formed and in a second region in the electrode where the conducting film is not formed, the surface acoustic wave propagating on the surface, radiating at least one transverse component of bulk waves in a direction of depth of the piezoelectric substrate, wherein a step difference (Hm+Hp1−Hp2)/(2P) of the surface of the insulating film normalized by 2P at a boundary between the first region and the second region satisfies the following formula:

$$-0.108 \times Hm/(2P) - 8.5 \times 10^{-3} \leq (Hm+Hp1-Hp2)/(2P) \leq -0.150 \times Hm/(2P) - 1.0 \times 10^{-3},$$

where a thickness of the conducting film is represented by Hm, a thickness of the insulating film in the first region is represented by Hp1(Hp1≧0), a thickness of the insulating film in the second region is represented by Hp2(Hp2>0), and a pitch of electrodes of the conducting film in the electrode is represented by P.

5. A surface acoustic wave device according to claim 3 or 4, wherein the insulating film covers the first region.

6. A surface acoustic wave device according to claim 3 or 4, wherein the piezoelectric substrate is a lithium tetraborate substrate.

7. A surface acoustic wave device according to claim 6, wherein a cut angle of the surface of the piezoelectric substrate and a propagation direction of the surface acoustic waves are an Eulerian angle representation of (0°–45°, 38°–55°, 80°–90°) and in a range equivalent thereto.

8. A surface acoustic wave device according to claim 6, wherein a cut angle of the surface of the piezoelectric substrate and a propagation direction of the surface acoustic waves are an Eulerian angle representation of (0°–45°, 30°–90°, 40°–65°) and in a range equivalent thereto.

9. A method for fabricating a surface acoustic wave device comprising:

a first step of forming a conducting film in a required pattern on a piezoelectric substrate to form an electrode for exciting, receiving, reflecting and/or propagating surface acoustic waves;

a second step of forming an insulating film in a first region in the electrode where the conducting film is formed and in a second region in the electrode where the conducting film is not formed; and a third step of setting a thickness Hp1 (Hp1≧0) of the insulating film in the first region and a thickness Hp2 (Hp2≧0) of the insulating film in the second region so that the first region and the second region have substantially equal acoustic impedances with respect to the surface acoustic waves, a step difference (Hm+Hp1−Hp2)/(2P) of the surface of the insulating film normalized by 2P at a boundary between the first region and the second region satisfying the following formula:

$$-0.108 \times Hm/(2P) - 8.5 \times 10^{-3} \leq (Hm+Hp1-Hp2)/(2P) \leq -0.150 \times Hm/(2P) - 1.0 \times 10^{-3},$$

where a thickness of the conducting film is represented by Hm, a thickness of the insulating film in the first region is represented by Hp1(Hp1≧0), a thickness of the insulating film in the second region is represented by Hp2(Hp2>0), and a pitch of electrodes of the conducting film in the electrode is represented by P.

10. A method for fabricating a surface acoustic wave device comprising:

a first step of forming a conducting film in a required pattern on a piezoelectric substrate to form an electrode for exciting, receiving, reflecting and/or propagating surface acoustic waves;

a second step of forming an insulating film in a first region in the electrode where the conducting film is formed and in a second region in the electrode where the conducting film is not formed; and a third step of setting a thickness Hp1(Hp1≧0) of the insulating film in the first region and a thickness Hp2(Hp2>0) of the insulating film in the second region so that the first region and the second region have substantially equal acoustic impedances with respect to the surface acoustic waves, a step difference (Hm+Hp1−Hp2)/(2P) of the surface of the insulating film normalized by 2P at a boundary between the first region and the second region satisfying the following formula:

$$-0.09 \times Hm/(2P) - 6.6 \times 10^{-3} \leq (Hm+Hp1-Hp2)/(2P) \leq -0.24 \times Hm/(2P) + 9.1 \times 10^{-3},$$

where a thickness of the conducting film is represented by Hm, a thickness of the insulating film in the first region is represented by Hp1(Hp1≧0), a thickness of the insulating film in the second region is represented by Hp2(Hp2>0), and a pitch of electrodes of the conducting film in the electrode is represented by P.

11. A method for fabricating a surface acoustic wave device according to any one of claims 9 or 10, wherein
the piezoelectric substrate is a lithium tetraborate substrate.

12. A method for fabricating a surface acoustic wave device according to any one of claims 9 or 10,
wherein the piezoelectric substrate is a lithium tetraborate substrate, and
wherein a cut angle of the surface of the piezoelectric substrate and a propagation direction of the surface acoustic waves are an Eulerian angle representation of (0°–45°, 38°–55°, 80–90°) and in a range equivalent thereto.

13. A method for fabricating a surface acoustic wave device according to any one of claims 9 or 10,
wherein the piezoelectric substrate is a lithium tetraborate substrate, and
wherein a cut angle of the surface of the piezoelectric substrate and a propagation direction of the surface acoustic waves are an Eulerian angle representation of (0°–45°, 30°–90°, 40°–65°) and in a range equivalent thereto.

14. A surface acoustic wave device comprising:
a piezoelectric substrate;
an electrode formed of a conducting film formed on the piezoelectric substrate for exciting, receiving, reflecting and/or propagating surface acoustic waves; and
an insulating film formed in a first region in the electrode where the conducting film is formed and in a second region in the electrode where the conducting film is not formed,
the surface acoustic wave propagating on the surface radiating at least one transverse component of bulk waves in a direction of depth of the piezoelectric substrate, a thickness Hp1(Hp1>0) of the insulating film in the first region and a thickness Hp2 (Hp2>0) of the insulating film in the second region being so set that the first region and the second region have substantially equal acoustic impedances with respect to the surface acoustic waves,
wherein a step difference (Hm+Hp1−Hp2) of the surface of the insulating film at a boundary between the first region and the second region satisfies the following formula:

$$-0.03 \leq (Hm+Hp1-Hp2)/\lambda \leq 0.01$$

where a thickness of the conducting film is represented by Hm, a thickness of the insulating film in the first region is represented by Hp1(Hp1>0), a thickness of the insulating film in the second region is represented by Hp2(Hp2>0), and a wavelength of the surface acoustic waves is represented by λ.

15. A surface acoustic wave device according to claim 14, wherein the piezoelectric substrate is a lithium tetraborate substrate.

16. A surface acoustic wave device according to claim 15, wherein
a cut angle of the surface of the piezoelectric substrate and a propagation direction of the surface acoustic waves are an Eulerian angle representation of (0°–45°, 38°–55°, 80°–90°) and in a range equivalent thereto.

17. A surface acoustic wave device according to claim 15, wherein a cut angle of the surface of the piezoelectric substrate and a propagation direction of the surface acoustic waves are an Eulerian angle representation of (0°–45°, 30°–90°40°–65°) and in a range equivalent thereto.

18. A method for fabricating a surface acoustic wave device comprising:
forming a conducting film in a required pattern on a piezoelectric substrate to form an electrode for exciting, receiving, reflecting and/or propagating surface acoustic waves;
forming an insulating film in a first region in the electrode where the conducting film is formed and in a second region in the electrode where the conducting film is not formed; and
setting a thickness Hp1(Hp1>0) of the insulating film in the first region and a thickness Hp2(Hp2>0) of the insulating film in the second region so that the first region and the second region have substantially equal acoustic impedances with respect to the surface acoustic waves,
providing a step difference (Hm+Hp1−Hp2) of the surface of the insulating film at a boundary between the first region and the second region satisfying the following formula:

$$-0.03 \leq (Hm+Hp1-Hp2)/\lambda \leq 0.01,$$

where a thickness of the conducting film is represented by Hm, a thickness of the insulating film in the first region is represented by Hp1(Hp1>0), a thickness of the insulating film in the second region is represented by Hp2(Hp2>0), and a wavelength of the surface acoustic waves is represented by λ.

19. The method according to claim 18, wherein the piezoelectric substrate is a lithium tetraborate substrate.

20. The method according to claim 19, wherein
a cut angle of the surface of the piezoelectric substrate and a propagation direction of the surface acoustic waves are an Eulerian angle representation of (0°–45°, 38°–55°, 80°–90°) and in a range equivalent thereto.

21. The method according to claim 19, wherein
a cut angle of the surface of the piezoelectric substrate and a propagation direction of the surface acoustic waves are an Eulerian angle representation of (0°–45°, 30°–90°, 40°–65°) and in a range equivalent thereto.

* * * * *